United States Patent
Lawson et al.

(10) Patent No.: US 6,794,879 B2
(45) Date of Patent: Sep. 21, 2004

(54) APPARATUS AND METHOD FOR DETECTING AND CALCULATING GROUND FAULT RESISTANCE

(75) Inventors: Rodney Allen Lawson, Fincastle, VA (US); William Robert Pearson, Salem, VA (US); Harold Copeland Sanderson, Tribes Hill, NY (US); Mohammed Kassem Saleh, Casa Grande, AZ (US); Gautam Sinha, Clifton Park, NY (US); Ivan Elmo Freeman, Jr., Roanoke, VA (US); Bruce Allen Gerritsen, Salem, VA (US)

(73) Assignee: General Electric Company, Schenectady, NY (US)

(*) Notice: Subject to any disclaimer, the term of this patent is extended or adjusted under 35 U.S.C. 154(b) by 32 days.

(21) Appl. No.: 09/986,467

(22) Filed: Nov. 8, 2001

(65) Prior Publication Data
US 2002/0140433 A1 Oct. 3, 2002

Related U.S. Application Data

(60) Provisional application No. 60/246,806, filed on Nov. 8, 2000.

(51) Int. Cl.[7] .............................................. G01R 31/02
(52) U.S. Cl. ....................... 324/509; 324/512; 324/522; 324/525
(58) Field of Search ................................ 324/509, 510, 324/525, 512, 522, 523, 534; 340/650, 651; 361/42; 702/57, 58, 59

(56) References Cited

U.S. PATENT DOCUMENTS

| | | | |
|---|---|---|---|
| 3,973,171 A | 8/1976 | Howell | 361/45 |
| 4,001,646 A | 1/1977 | Howell | 361/45 |
| 4,159,499 A | 6/1979 | Bereskin | 361/42 |
| 4,161,011 A | 7/1979 | Wilkinson | 361/80 |
| 4,206,398 A | 6/1980 | Janning | 324/509 |
| 4,667,263 A | 5/1987 | Morris et al. | 361/42 |
| 4,825,327 A | 4/1989 | Alexander et al. | 361/82 |
| 5,057,962 A | 10/1991 | Alley et al. | 361/24 |
| 5,363,047 A | * 11/1994 | Dresti et al. | 324/510 |
| 5,739,693 A | 4/1998 | Pfiffner | 324/509 |
| 5,933,306 A | 8/1999 | Santos et al. | 361/45 |
| 6,169,489 B1 | 1/2001 | Kilman et al. | 340/648 |
| 6,262,550 B1 | 7/2001 | Kilman et al. | 318/565 |

OTHER PUBLICATIONS

Copy of International Search Report from PCT/US01/43017 mailed May 14, 2003.

\* cited by examiner

*Primary Examiner*—N. Le
*Assistant Examiner*—Vincent Q. Nguyen
(74) *Attorney, Agent, or Firm*—Hunton & Williams LLP

(57) ABSTRACT

The field ground fault detector of the present invention detects a ground fault that occurs in the field circuit and in any associated circuits galvanically connected to the field. The field ground fault detector discerns the ground resistance so that it can be monitored to detect gradual degradation of the ground resistance. The detector estimates the resistance of the ground fault and the location of the ground fault. The detector is able to estimate the location of the ground fault during system operation and during periods of non-operation. The invention utilizes a low frequency square wave oscillator to permit measurement of the ground fault resistance when field voltage is not applied, to insure that there are no blind spots when the field is energized, and to provide a method for estimating the ground fault resistance. The field ground detector can differentiate between ground faults that occur on the AC side form those on the DC side of the Thyristor Bridge.

21 Claims, 14 Drawing Sheets

ATTENUATOR MODULE

TIMING DIAGRAM FOR TEST MODE OPERATION

OPERATION OF FIELD GROUND DETECTOR DURING TEST MODE

APPARATUS AND METHOD FOR DETECTING AND CALCULATING GROUND FAULT RESISTANCE

CROSS REFERENCE TO RELATED APPLICATIONS

This application claims the benefit of U.S. Provisional Application No. 60/246,806, filed on Nov. 8, 2000, which is incorporated herein by reference in its entirety.

A portion of the disclosure of this patent document contains material which is subject to copyright protection. The owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention generally relates to an apparatus and method for detecting and calculating ground fault resistance. In a more specific embodiment, the present invention relates to an apparatus and method for calculating ground fault resistance, including an estimate of ground fault location.

It is common practice in the industry to isolate the field of a generator from ground. Excitation systems supplied for these applications are also isolated from ground and have traditionally included a field ground detector to detect the presence of a ground and to either generate an alarm or trip the generator. Indeed, the field ground detector has become standard in most exciter applications. The presence of one ground in the field or associated excitation equipment does not pose a problem, but the presence of a second ground can cause large currents to flow, which may cause damage to the equipment. Examples of applications pertinent to this invention are excitation systems and regulator systems in generator applications.

Historically, ground detectors have measured leakage current and have included some provision to ensure that a ground occurring anywhere in the field circuit can be detected, e.g., to ensure that there are no "blind spots." Further, these devices are required to operate even when the field is not energized. These features resulted in devices that applied a continuous voltage from one field lead to ground. This produced the negative consequence of raising the field structure above ground and causing the sensitivity to vary as a function of applied field voltage.

In other applications, a low frequency oscillator has been used to replace the continuous voltage to ground applied to one field lead. The oscillator modulates the center of the field by a small voltage above and below ground. This solution eliminates the elevation in voltage of one field lead above ground. However, this solution has shortcomings. For instance, this solution does not eliminate the equipment's variable sensitivity as a function of applied field voltage. Further, present implementations may operate in an incorrect manner in the presence of certain ground faults.

Further, it is desirable that the field ground detector operate correctly in the presence of high common mode voltages, and switching voltages associated with a Thyristor Bridge. Present implementations suffer from variable sensitivity and incorrect operation in the presence of certain ground faults.

Accordingly, there is a need for a more efficient apparatus and method for calculating ground fault resistance, including an estimate of ground fault location. There is a further need to monitor the ground resistance to detect degradation of ground insulation.

BRIEF SUMMARY OF THE INVENTION

The solution described herein satisfies the above-described needs, as well as additional needs.

One exemplary purpose of the solution described herein is to detect a ground fault that occurs anywhere in the field circuit and in any of the exciter circuits galvanically connected to the field. A further exemplary purpose of the solution is to be able to identify the ground resistance so that it can be monitored to detect gradual degradation of the ground resistance. A further exemplary purpose is to provide the ability to estimate the location of the ground fault when the excitation system is in operation.

The field ground detection arrangement of the present invention has the ability to estimate the actual resistance of the ground fault and to further estimate the location of the ground fault. The invention can operate in the presence of high common mode voltages, rapid switching events and large capacitors to ground from each field lead. In one manner, the invention utilizes a low frequency square wave oscillator to permit measurement of the ground fault resistance when field voltage is not applied, to insure that there are no blind spots when the field is energized, and to provide a method for estimating the ground fault resistance.

The field ground detector can detect a fault essentially anywhere in the field circuit and in the power components associated with the excitation system. Ground faults that occur on the AC side of the Thyristor Bridge will be identified as AC ground faults for fault resistances less than 1500 ohms. Fault resistances greater than this value will be correctly identified but will not distinguish the fault as being on the AC side of the bridge. The field ground detector incorporates redundant techniques to increase the reliability and has provisions for measuring the low frequency oscillator voltage as a means of increasing the accuracy of the ground fault resistance calculation.

The low frequency oscillator voltage is, in one manner, measured at every transition in voltage levels, whereby much of the ground detector is tested every half cycle resulting in enhanced diagnostics. A "test" function may also be supplied to force the low frequency oscillator to go to a much higher frequency during the test and measures the signature of the resulting signal. Thereby providing a more complete functional test of the ground detector and performs properly even in the presence of a preexisting ground fault.

As discussed above, the solution of providing a low frequency oscillator that essentially modulates the center of the field a small voltage above and below ground does not eliminate the variable sensitivity with applied field voltage. One aspect of the present invention utilizes a low frequency oscillator to avoid biasing one of the field leads above or below ground and removes the variable sensitivity of the field ground detector with field voltage.

Static excitation systems generally require the addition of a filter circuit, commonly known as a shaft voltage suppressor, to avoid coupling rapidly changing AC voltages into the shaft. These filters are traditionally implemented as RC circuits from each field lead to ground and the field ground detector has to operate correctly with these devices in place. The field ground detector of the present invention utilizes the response of the shaft voltage suppressor to fault resistances on the AC side of the bridge structure to identify the fault as being on the AC side of the bridge. This inventive aspect further provides a method for using redundant techniques to enhance the reliability of the field ground detector when used with redundant excitation systems.

In summary, one objective of the invention is to detect a ground fault that occurs anywhere in the field circuit and in any of the exciter circuits galvanically connected to the field. A further objective is to identify the ground resistance to effectively monitor to detect gradual degradation of the ground resistance. A further objective is to estimate the location of the ground fault when the excitation system is in operation. To bolster reliability objectives, the ground detector may utilize redundancy concepts. It is a further object to provide diagnostics to manage, monitor and maintain the operation and efficacy of the field ground fault detector of the present invention.

In one embodiment, the present invention provides a system for detecting field ground, comprising a sense resistor, an attenuator network, a reference signal source, a voltage controlled oscillator, and control logic. The reference signal source provides a reference signal to field leads of a generator. The reference signal is operatively coupled with the sense resistor and an attenuator network, wherein the attenuator network is coupled to both field leads resulting in a signal that biases the center of the field plus and minus the reference signal with respect to ground. The voltage controlled oscillator (VCO) measures differential voltage across the sense resistor. And the control logic coordinates the collection of measurement data, and extracts an estimate of ground fault resistance and location of a ground fault from the measured data.

In yet another embodiment, the present invention provides a method for use in a control system for operating an electrical machine. The method involves detecting and measuring a field ground fault and comprises the steps of: sensing the resistance of a sense resistor; applying a reference signal to field leads of the generator through the sense resistor and attenuator network, wherein the attenuator network is coupled to both field leads resulting in a signal that biases the center of the field within a range of plus and minus the reference signal with respect to ground; measuring the differential voltage across the sense resistor; analyzing the collected measurement data; and detecting a ground fault and estimating ground fault resistance and location of a ground fault from the measured data.

Still further features, purposes and advantages of the present invention are identified in the ensuing description, with reference to the drawings identified below.

DETAILED DESCRIPTION OF THE PREFERRED EMBODIMENT

Figure 1:
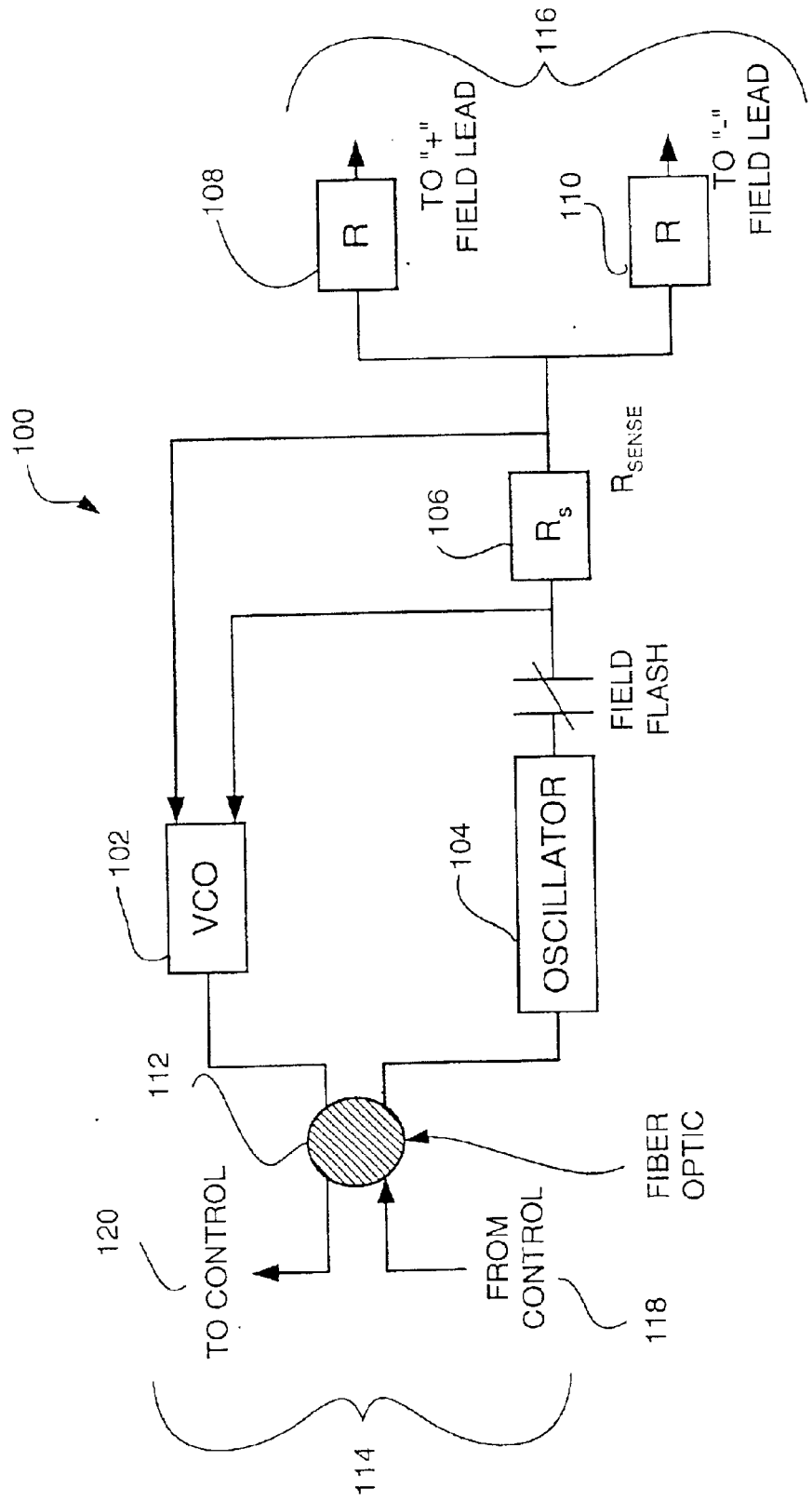
FIG. 1 shows an exemplary non-redundant field ground detector implementation of the present invention.

The method and apparatus of the field ground detector of the present invention is described herein for use in excitation control systems for operating generators, such as used in steam, gas, and hydro generation. An example of an overall control system is discussed below and represented in the schematic drawing of FIG. 12. The system may be fully or partially digital and may be provided in any of a number of configurations. The system may be communicatively coupled for access and control via any of a number of known networks, e.g., Ethernet, Internet, LAN, WAN, etc., and in hardwired or wireless fashion. The particular configurations and manners described herein are by way of example and it is understood that the field ground detector of the present invention may be implemented in a number of different ways for use in a wide variety of configurations and applications. Further, as technology continues to evolve, it is understood that beneficial use of the present invention may be enjoyed in conjunction with such evolving technology.

By way of overview and introduction, the solution offered by the present invention described herein has the ability to estimate the actual resistance of a ground fault and to further estimate the location of the ground fault. More specifically, the field ground detector can detect a fault anywhere in the field circuit and in the power components associated with the excitation system. For instance, ground faults that occur on the AC side of the Thyristor Bridge will be identified as AC ground faults for fault resistances less than 1500 ohms. Fault resistances greater than this value will be correctly identified, but, in one exemplary embodiment, the apparatus will not distinguish the fault as being on the AC side of the bridge. The solution also can operate in the presence of high common mode voltages, rapid switching events, and large capacitors to ground from each field lead.

In one manner, a low frequency square wave oscillator is used to provide the above features. The use of this oscillator permits measurement of the ground fault resistance when field voltage is not applied. This ensures that there are no blind spots when the field is energized. The ground detector also has provisions for measuring the low frequency oscillator voltage as a means of increasing the accuracy of the ground fault resistance calculation. Further, the low frequency oscillator voltage is measured at every transition in voltage level. As such, much of the ground detector is tested every half cycle, resulting in enhanced diagnostics. Further, the use of a low frequency oscillator avoids biasing one of the field leads above or below ground and removes the variable sensitivity of the field ground detector with respect to field voltage.

According to another feature, static excitation systems require the addition of a filter circuit, commonly known as a shaft voltage suppressor, to avoid coupling rapidly changing AC voltages into the shaft. These filters are traditionally implemented as RC circuits coupling each field lead to ground; the field ground detector is required to operate correctly with these devices in place. The solution described herein utilizes the response of the shaft voltage suppressor to fault resistances on the AC side of the bridge structure to identify the fault as being on the AC side of the bridge.

Further, the ground detector incorporates redundant implementation strategies to increase the reliability of the apparatus. A "test" function is also supplied which forces the low frequency oscillator to operate at a much higher frequency during the test and measure the signature of the resulting signal. This provides a more complete functional test of the ground detector, and performs properly even in the presence of a pre-existing ground fault.

To begin with, FIG. 1 illustrates a non-redundant field ground detector implementation of the present invention, referenced generally at 100. A low frequency square wave oscillator 104 is applied to the field leads 116 of the generator through a sense resistor 106 and an attenuator network. The attenuator network 108, 110 connects to both fields resulting in a signal that biases the center of the field plus and minus the oscillator voltage with respect to ground. The is, neither field lead is individually biased with respect to ground, eliminating one of the shortcomings of earlier implementations (e.g., the problem caused by the elevation of one lead to bias voltage plus field voltage above ground). When a ground fault occurs, current through the sense resistor 106 produces a voltage across it, that is fed into a voltage-controlled oscillator (VCO) 102, and the output of the VCO 102 is transmitted as a frequency back to a exciter control 114 through a fiber optic network 112.

The exciter control (generally represented by interface 114) interfaces to the ground detector by sending an oscillator voltage command through a fiber optic cable 118 via a fiber optic network 112, and reading the sense voltage through a second fiber optic cable 120. Power from the exciter control is used to power an isolated power supply (not shown) in the field ground detector so that the field ground detector remains completely isolated from the exciter control circuit.

The computational functionality of the exciter control is used to provide signal conditioning and algorithmic control of the signals measured in the field ground detector. This functionality is used to extract an estimate of the ground resistance and location of the ground fault from the measured data. A very low frequency square wave oscillator 104 is utilized to avoid responding to shaft voltage suppressor capacitor charging currents, which are present in most, if not all, static excitation systems. One advantage of using a processor to estimate the ground fault resistance is that the processor can be programmed to examine the ground current after the charging transient has died out, thus eliminating the error caused by charging current.

Figure 2:
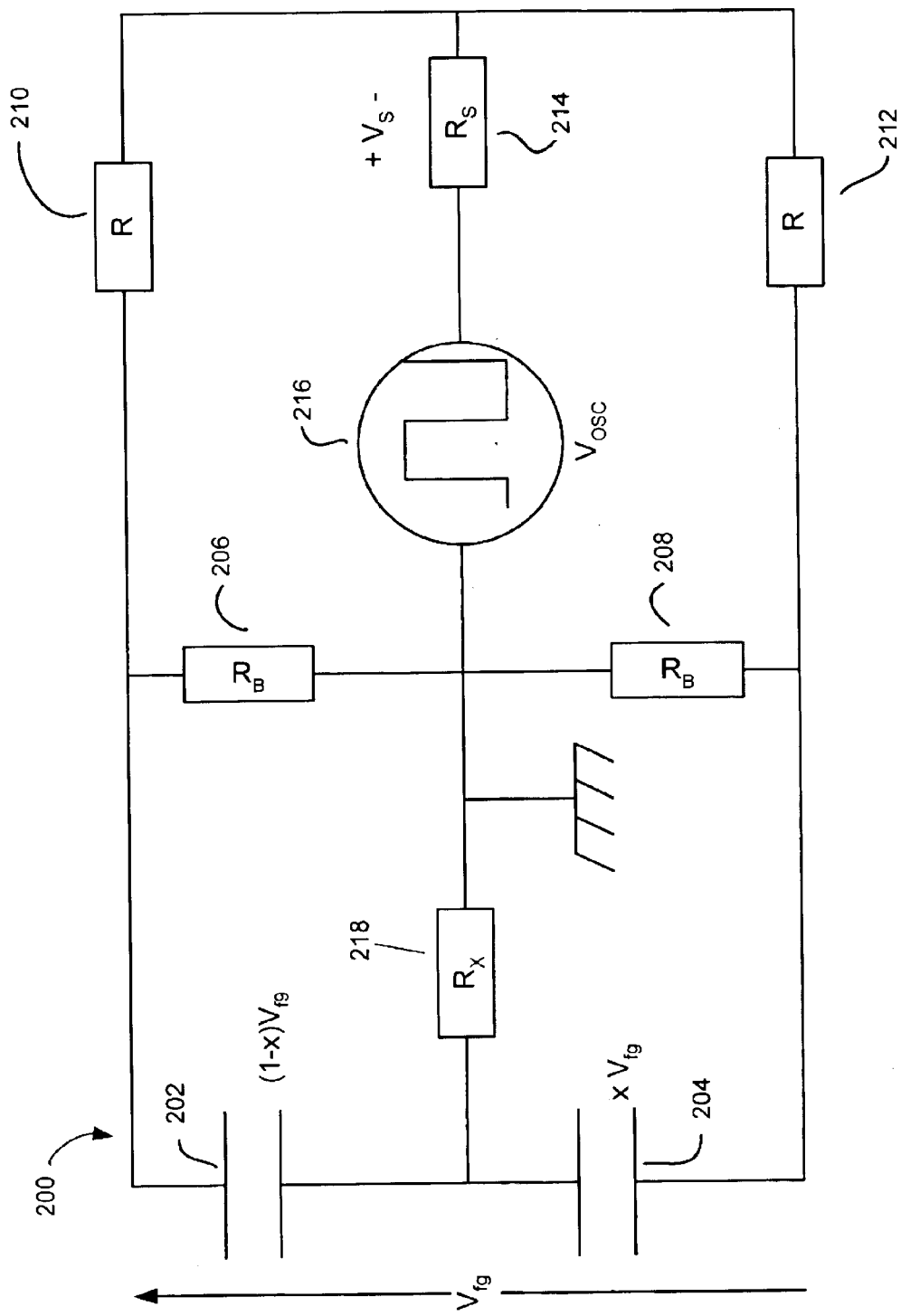
FIG. 2 shows an exemplary circuit diagram for steady state DC operation including bleeder resistors positioned across shaft voltage suppressor capacitors.

The functionality estimates the ground fault resistance by performing measurements on two consecutive half cycles of the low frequency oscillator voltages. FIG. 2 illustrates a circuit diagram for steady state DC signals including bleeder resistors (Rb) (206, 208) across the shaft voltage suppressor capacitors (202, 204), and attenuator resistors (R)(210, 212). On the positive half cycle of oscillator voltage, the voltage across the sense resistor (Rs) 214 is given by the following Equation 1.0:

$$Vs1 = (Rd^*Voscp + ReVfgp + Rf^*x^*Vfgp)/(R^\wedge 2Rb^\wedge 2 + 2R^\wedge 2RbRx + 2RRb^\wedge 2Rx + 2RRb^\wedge 2Rs + 4RRbRsRx).$$

In this equation, Voscp is the oscillator voltage on the positive half cycle, Rx is the ground fault resistance, and x*Vfgp is the voltage from the negative field lead to the ground fault point during the positive half cycle. By similar reasoning, the sense voltage on the negative half cycle is given by the Equation 2.0:

$$Vs2 = (Rd^*Voscn + ReVfgn + Rf^*x^*Vfgn)/(R^\wedge 2Rb^\wedge 2 + 2R^\wedge 2RbRx + 2RRb^\wedge 2Rx + 2RRb^\wedge 2Rs + 4RRbRsRx).$$

In this equation, Voscn is the oscillator voltage on the negative half cycle, Rx (218) is the ground fault resistance, and x*Vfgn is the voltage from the negative field lead to the ground fault point during the negative half cycle. It should be noted that there is no assumption that the field voltage remains constant, since a voltage regulator, responding to terminal voltage and loading, controls field voltage.

Equation 1.0 may be expressed as a function of Vfgn (the field voltage during the time the oscillator is negative) by multiplying Equation 1.0 by Vfgn/Vfgp. This results in Equation 3.0 as follows.

$$(Vfgn/Vfgp)^*Vs1 = (Vfgn/Vfgp)(Rd^*Voscp) + ReVfgn + Rf^*xVfgn)/(\text{Denominator from Eq 1.0 or Eq. 2.0})).$$

Subtracting Equation 2.0 from Equation 3.0 yields the following Equation 4.0:

$$(Vfgn/Vfgp)^*Vs1 - Vs2 = Rd^*(Voscp^*(Vfgn/Vfgp) - Voscn)/(\text{Denominator from Equation 1.0, 2.0 or 3.0}).$$

Equation 4.0 no longer specifies the location of the ground fault (x) and is only dependent on measured quantities and fixed resistors. Resistors Rd, Re, and Rf are equivalent resistors given by the equations:

$$Rd = 2RRb^\wedge 2Rs + 4RRbRsRx,$$

$$Re = -RRb^\wedge 2Rs;$$

and $$Rf = 2RRb^\wedge 2Rs.$$

The calculation of the ground fault resistance is then found using the following Equation 5.0:

$$Rx\{(2RbR^\wedge 2 + 4RRbRs + 2RRb^\wedge 2)((Vfgn/Vfgp)Vs1 -$$

$$Vs2) + (-4RRbRs)((Vfgn/Vfgp)Vosco - Voscn)\} = (-R^\wedge 2$$

$$Rb^\wedge 2 - 2RRb^\wedge 2Rs)((Vfgn/Vfgp)Vs1 - Vs2) +$$

$$2RRsRb^\wedge 2((Vfgn/Vfgp)Voscp - Voscn).$$

This removes the need for a quadratic solution and results in Equation 6.0 for the calculation of the ground resistance:

$$Rx = \{(2RRsRb^\wedge 2 + R^\wedge 2$$

$$Rb^\wedge 2)((Vfgn/Vfgp)Vs1 -$$

$$Vs2) - 2RRsRb^\wedge 2((Vfgn/Vfgp)^*$$

$$Voscp - Voscn)\}/\{(2RbR^\wedge$$

$$2+4RRbRs+2RRb^2)(Vs2-$$

$$(Vfgn/Vfgp)Vs1)+4RRbRs((Vfgn/Vfgp)*$$

$$Voscp-Voscn)\}.$$

For the case of zero field voltage, Vfgn/Vfgp is unity and the equation for the calculated ground fault resistance is given by Equation 7.0:

$$Rx=\{(2RRsRb^2+R^2Rb^2)(Vs1-Vs2)-2RRsRb^2(Voscp-Voscn)\}/\{(2RbR^2+4RRbRs+2RRb^2)(Vs2-Vs1)+4RRbRs(Voscp-Voscn)\}.$$

With the ground fault resistance identified in Equation 6.0, it is possible to go back to either Equation 1.0 or 2.0 and solve for the location of the ground fault, x. The equation for the location of the ground fault is then finally provided by Equation 8.0.

$$x=(Vs1*(RRb^2+2R^2RbRx+2RRb^2Rx+4RRbRsRx)-(2RRb^2Rs+4RRbRsRx)*Voscp+(RRsRb^2)*Vfgp)/(2RRsRb^2*Vfgp).$$

In this equation, x is the distance from the negative field lead to the location of the ground fault divided by the total distance from the negative field lead to the positive field lead. A value for x of "zero" corresponds to a ground fault on the negative field lead while a value for x of "one" corresponds to a ground on the positive field lead.

A second equation for calculation of the ground fault location can be found, in a similar manner to equation 7.0, by substituting Vfgn for Vfgp and substituting Voscn for Voscp. Such a derivation provides Equation 9.0 as follows:

$$x=(Vs2*(RRb^2+2R^2RbRx+2RRb^2Rx+4RRbRsRx)-(2RRb^2Rs+4RRbRsRx)*Voscn+(RRsRb^2)*Vfgn)/(2RRsRb^2*Vfgn).$$

Equations 8.0 and 9.0 don't work optimally for field voltages of zero (because of problems caused by division by zero). Therefore, these equations should be preferably used when the field is energized. Estimation of the ground fault resistance, Rx, can be made with the unit energized or de-energized. Estimation of the ground fault location should preferably be made with the unit energized and running with field voltage present.

Grounds that occur on the AC side of the Thyristor Bridge result in similar average currents to a ground that occurs at the center of the generator field. The distinguishing characteristic of such grounds is that significant fundamental frequency current flows when an AC ground exists. This fact is utilized to identify the ground fault as being on the AC side of the Thyristor Bridge.

More specifically, an attenuator, capacitor filter and sense resistor are designed to yield a fundamental frequency voltage across the sense resistor of at least 0.75 volt RMS for ground fault resistances less than 1500 ohms. The solution described herein will correctly identify the fault as being an AC fault if the ground fault resistance is 1500 ohms or less. In any case, the resistance of the ground fault, whether on the AC or DC side of the Thyristor Bridge, will be correctly identified for ground fault resistances of 40000 ohms and less. Ground faults that occur on the AC side of the Thyristor Bridge can only be identified when the bridge is de-energized by including resistors in parallel with the thyristors. The resistors are also required in order to force equal division of the low frequency pole slip voltage across the thyristors in a bridge. These pole slip resistors reduce the accuracy of the ground fault calculation, for a ground fault on the AC side of the Thyristor Bridge, when the bridge is de-energized. When the field is energized, accuracy of the ground fault calculation is not different for an AC ground fault verses a DC ground fault.

Figure 3:
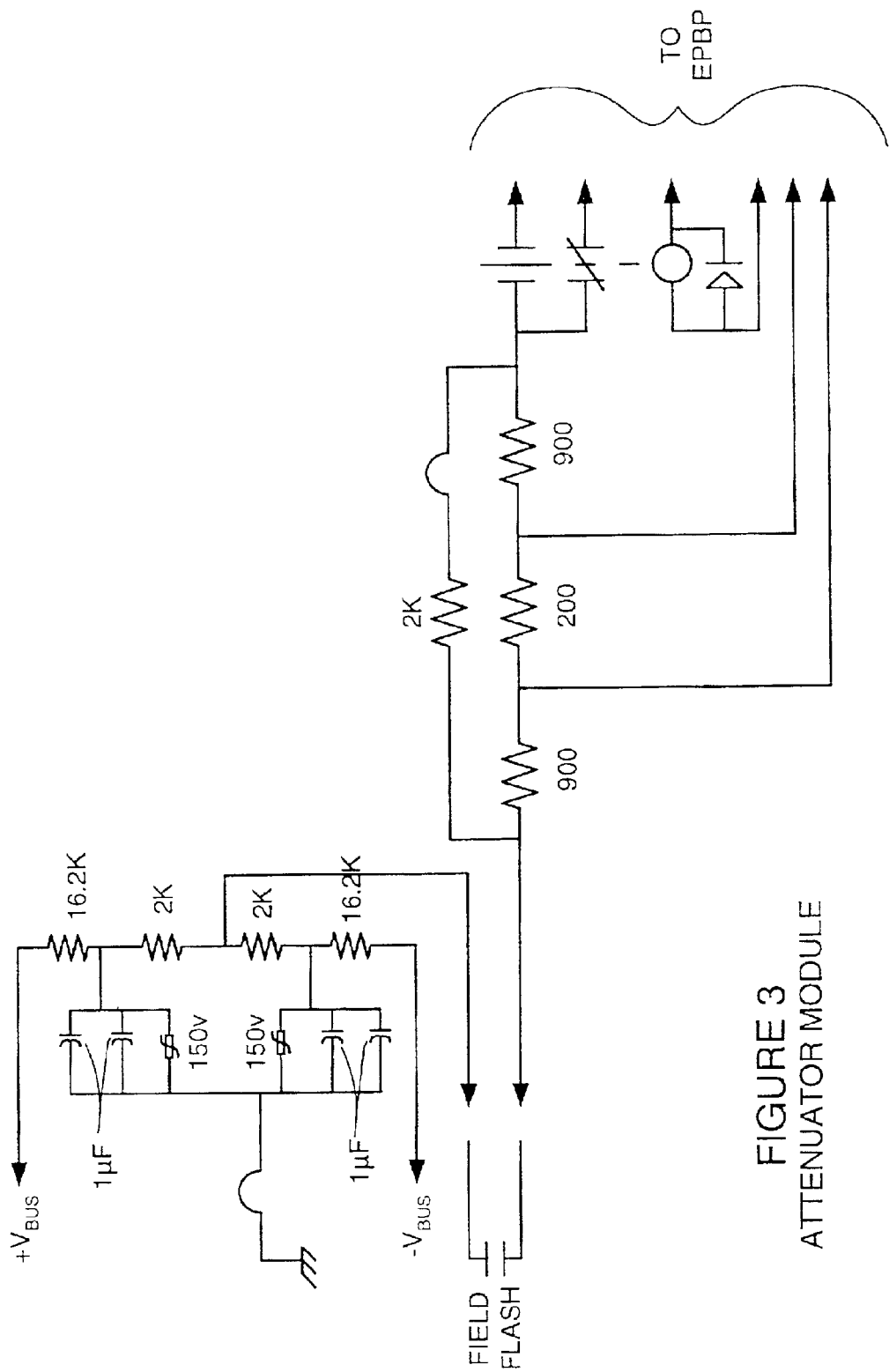
FIG. 3 shows exemplary attenuator logic used for exciter input transformer voltages, e.g., between 750 vrms and 1125 vrms.

FIG. 3 illustrates the attenuator module used for exciter input transformer voltages between 750 Vrms and 1125 Vrms. The attenuator resistors of 16.2 kohms and 2 kohms are used to limit the flow of current through the sense resistors formed by the 2 kohm resistor in parallel with two 900 ohm resistors in series with the 200 ohm resistor. The two capacitors with a value of one microfarad each, that are in parallel from the attenuator string to ground limit the fundamental frequency component of voltage applied to the sense resistor. The MOVs from the attenuator string to ground limit the maximum voltage to ground applied to the sense resistor. The relay shown is controlled by controller C and determines which oscillator (M1 or M2) is applied to the sense resistor and attenuator string.

From Equation 6.0, it is useful to measure the field voltage and oscillator voltage on every half cycle of oscillator voltage in order to increase the accuracy of the ground fault calculation. The solution described herein takes advantage of the fact that the exciter already has an accurate measurement of field voltage for other reasons and then implements an accurate measurement of the oscillator voltage.

Figure 4:
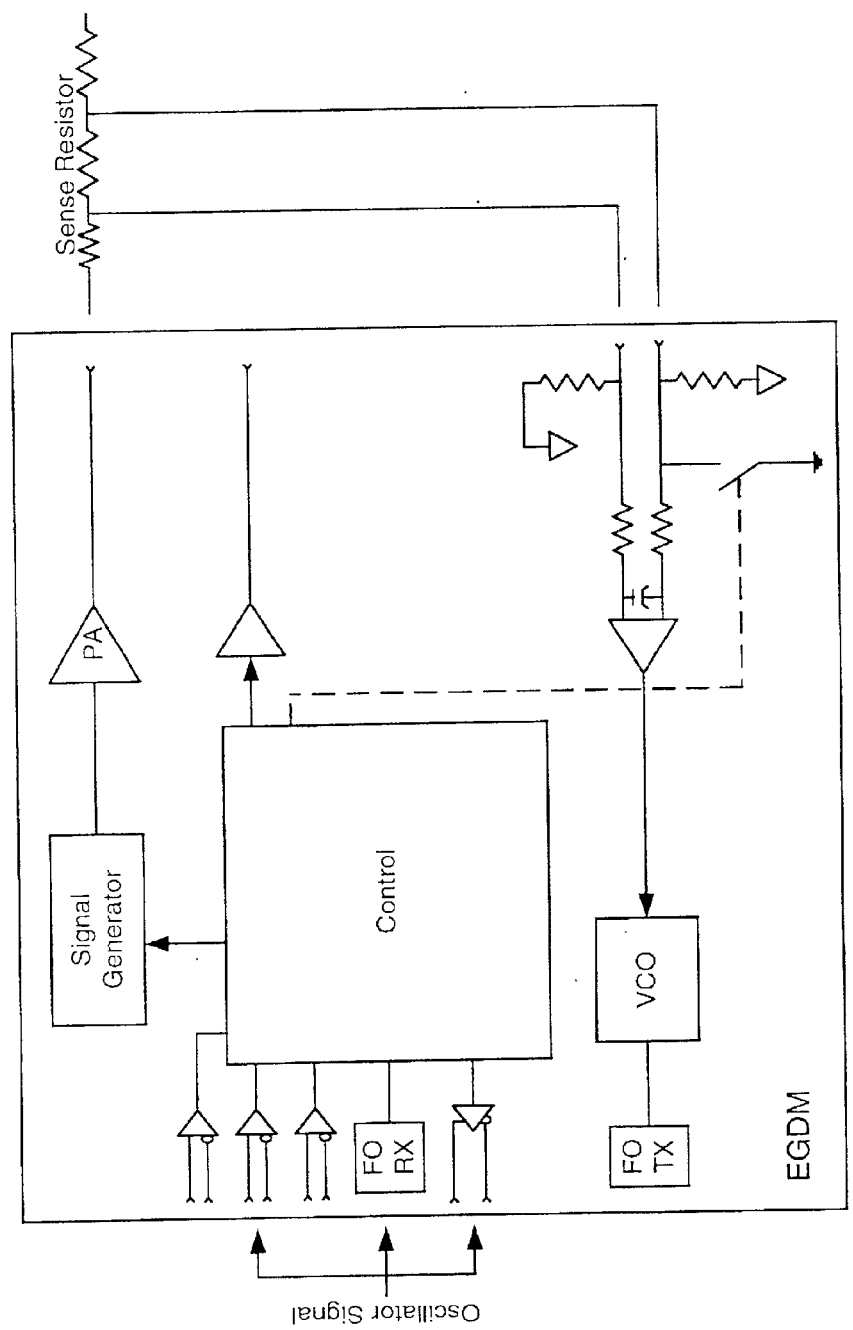
FIG. 4 illustrates exemplary logic for measuring a sense voltage and oscillator voltage.

FIG. 4 illustrates the technique used in the present solution to measure the sense voltage and oscillator voltage. Not shown is the power supply which takes an input voltage from either master (M1/M2), or the protection controller (C or C3), provides isolation from the control, and then provides the appropriate voltages for the ground detector card. The P24 and N24 power supplies from each control (M1, M2, C3) are connected to the appropriate ground detector card (EGDM in one implementation) and are used to power converters which generate the required P50 and N50 power supplies, transformer isolated from the P24 and N24.

Figure 5:
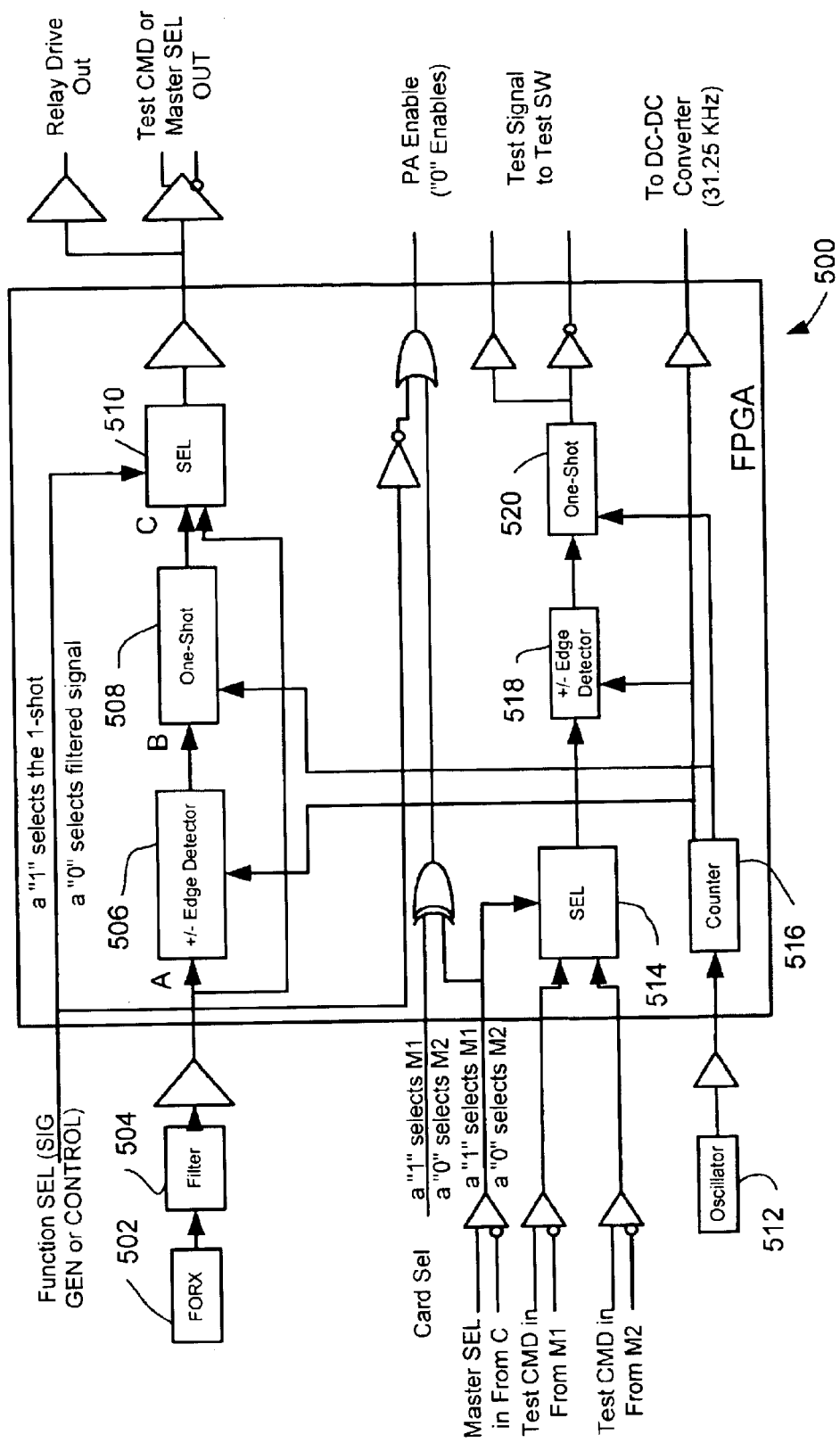
FIG. 5 shows exemplary logic used to detect a non-normal commanded oscillator frequency and to force a VCO to measure the differential voltage across a sense resistor for the duration of a test.

FIG. 5 illustrates exemplary logic used to force a correct measurement of the sense resistor or oscillator output. The logic 500 includes a FORX 502, filter 504, ±edge detector blocks 506, 518, 250 msec retrip one shot blocks 508, 520, select blocks 510, 514, 1 MHz oscillator 512, counter 516, and other elements as shown in FIG. 5, for example. In operation, the voltage of the ground current sense resistor is temporarily changed to function as a measurement to ground of the output of the oscillator for the first 200 milliseconds after the command to change the level of the oscillator is given. The logic shown in FIG. 5 accomplishes this function using a field programmable gate array (FPGA) 500. More specifically, a +/− edge detector 506 is used to trigger a retriggerable 250 msec one shot unit 508 on either a positive or negative command. A function selector input 510 permits the same card to be used for a master controller (M1/M2) or the protection controller (C3) in a redundant configuration. If the card is mounted in either the M1 or M2 slot, it automatically selects the output of the 250 msec retriggerable one shot. In contrast, if the card is mounted in the C3 slot, the selector 510 selects the filtered signal from the fiber optic receiver 502 and filter 504. For either M1 or M2, the output of the selector 510 is used to drive a test command which is used with a plus edge detector 518 and 250 msec one shot unit 520 to develop a signal for a test switch.

Figure 6:
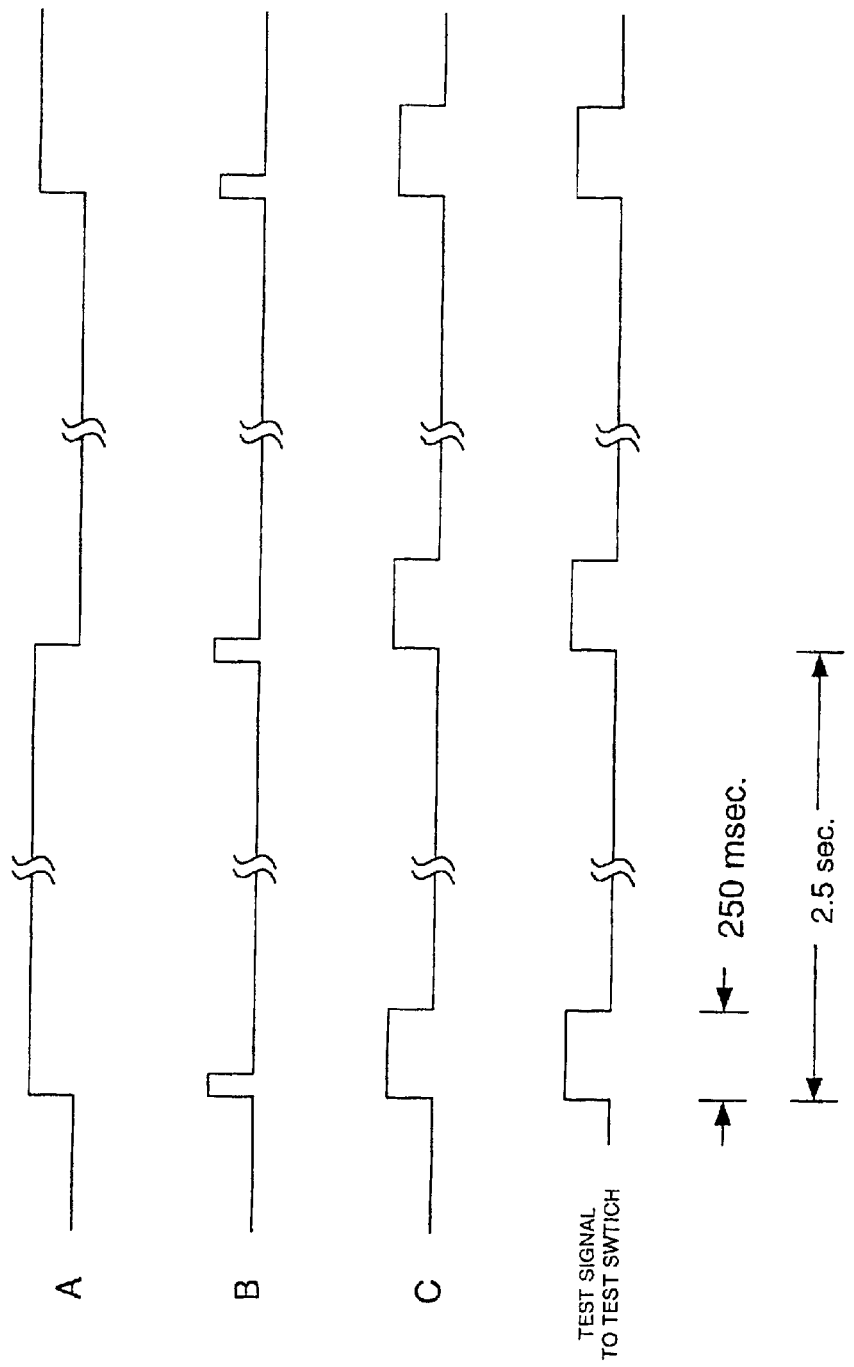
FIG. 6 shows a timing diagram corresponding to a normal operation of the invention.
Figure 7:
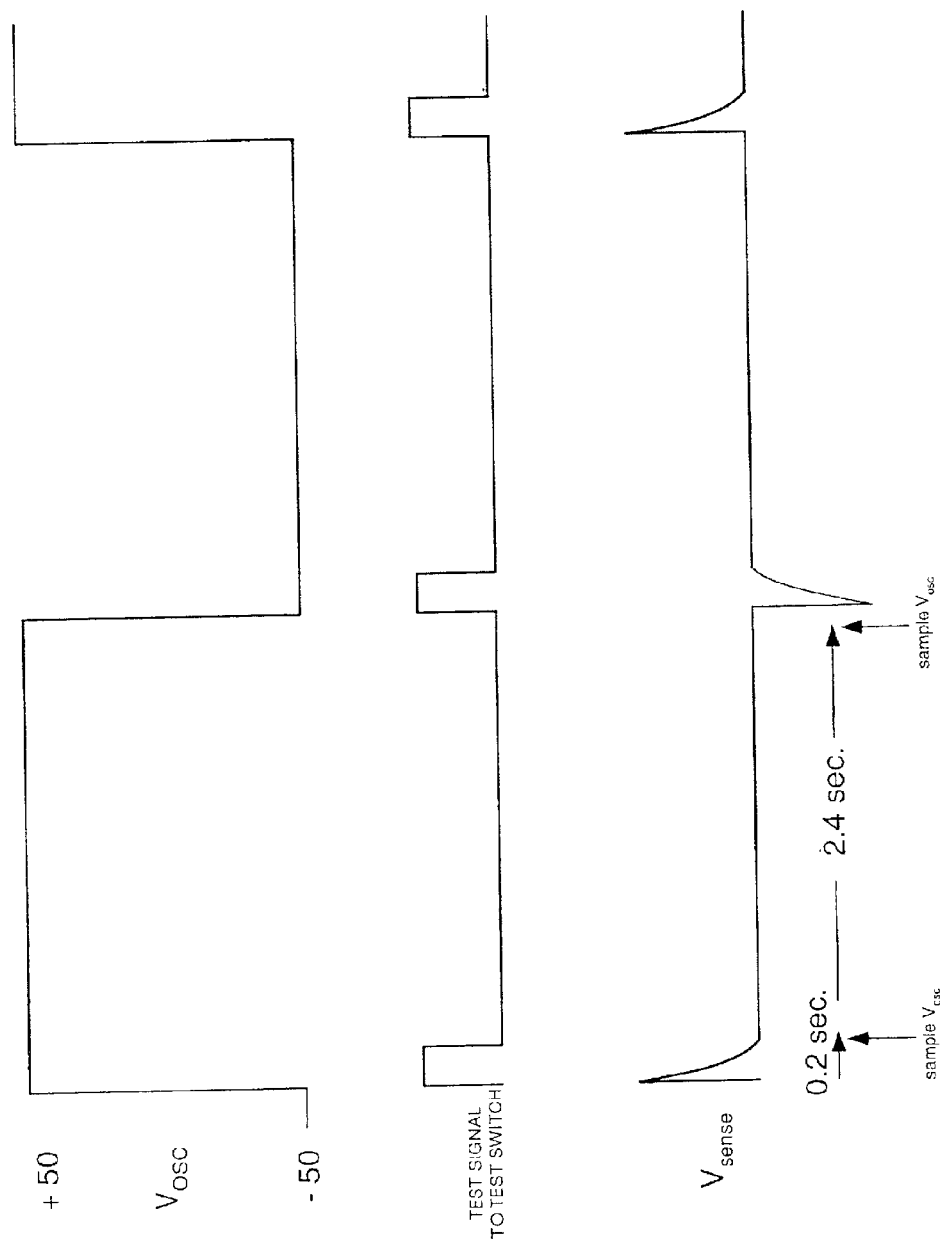
FIG. 7 shows waveforms that illustrate normal operation of the field ground detector.
Figure 8:
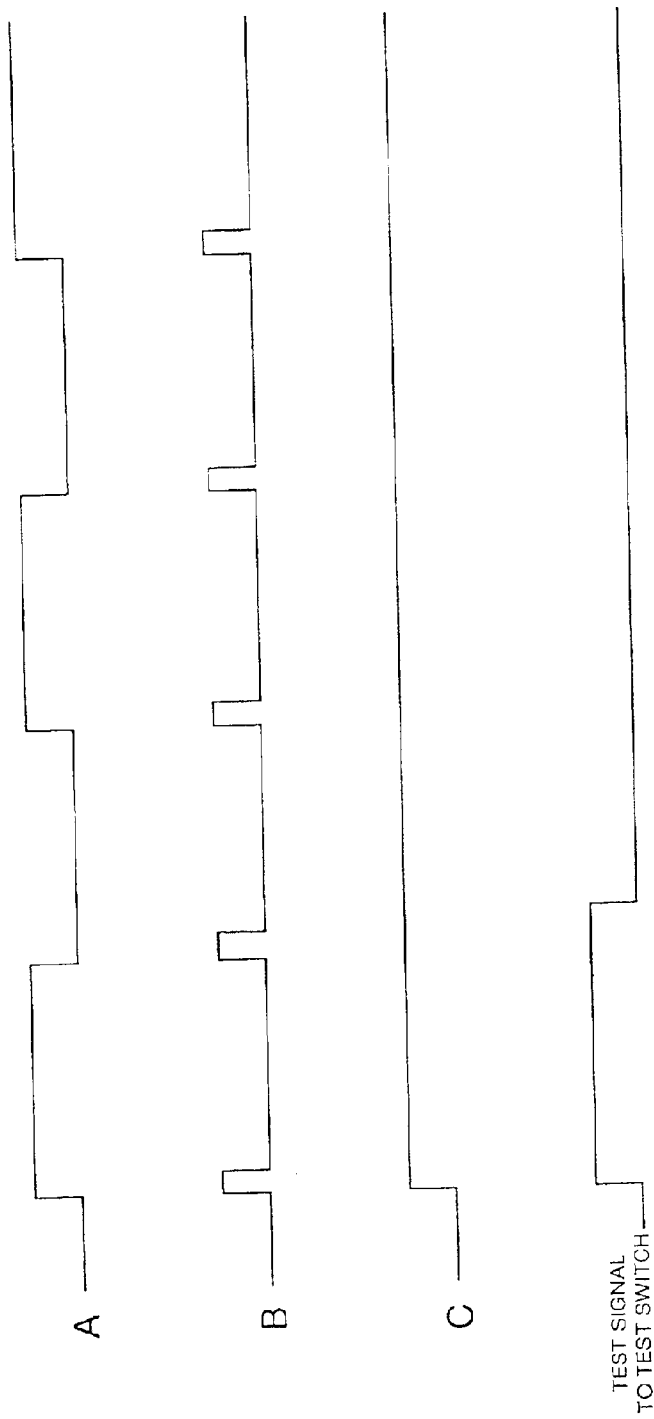
FIG. 8 shows a timing diagram corresponding to a test mode operation of the invention.
Figure 9:
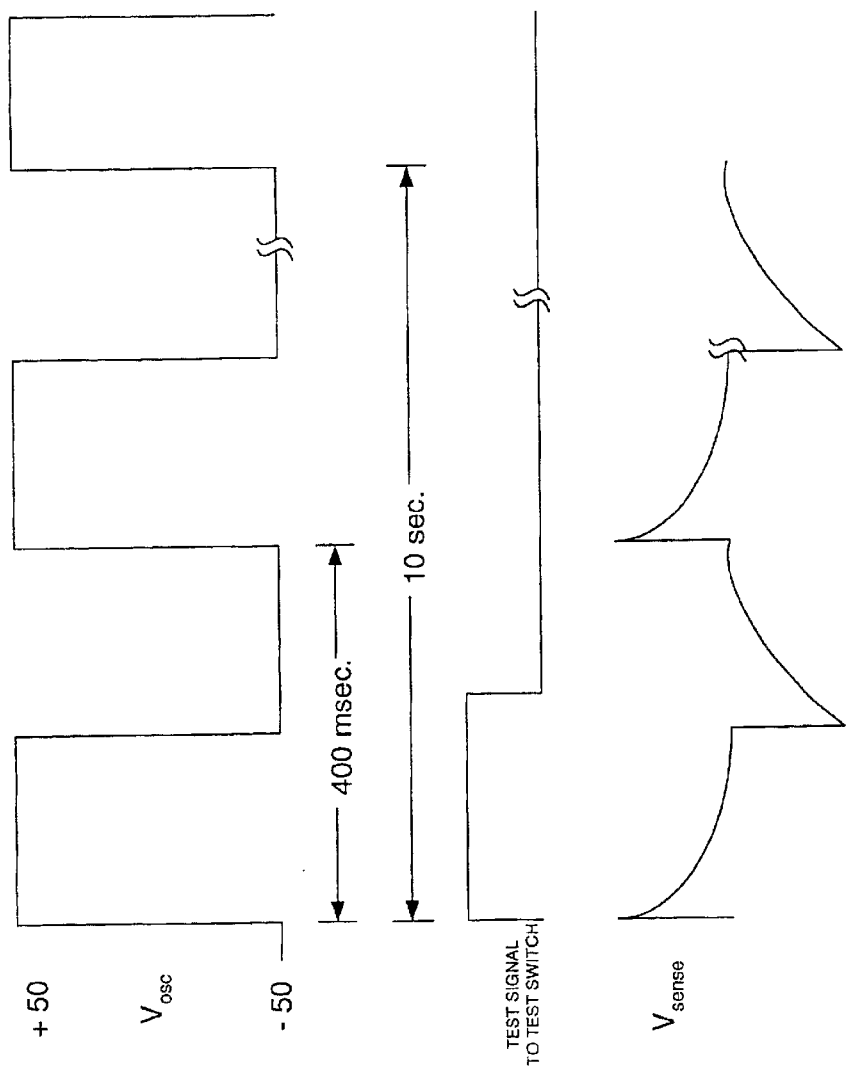
FIG. 9 shows waveforms that illustrate the operation of the field ground detector during a test mode.

As a net result, the 250 msec one shot unit 508 generates a single positive-going 250 msec pulse at every commanded transition in oscillator voltage to drive the switch that converts the sense resistor to a ground referenced measurement during normal operation. FIG. 6 and FIG. 7 illustrate the signal characteristics of this functionality with FIG. 7 representative of normal operating conditions of the field ground detector. Further, the one shot unit 520 generates a single 250 msec pulse during the test mode, and then holds the command to the switch to force a measurement with respect to ground until the 10 second test period is finished. FIGS. 8 and 9 illustrate the signal characteristics of this functionality.

More specifically, FIG. 6 shows a timing diagram for normal operation, while FIG. 8 shows a timing diagram for operation in test mode and FIG. 9 represents conditions during operation of the field ground detector during test mode. The control will wait 200 msec after a commanded transition in oscillator levels to read the signal from the fiber optic transmitter in the FGD 500 illustrated in FIG. 5. Filtering is selected so that the response to a step input is within 0.2% of the final value after 200 msec. This permits a very accurate low noise measurement of the oscillator voltage for use in oscillator and VCO diagnostics. This solution also improves the accuracy of the ground detector algorithms.

Figure 10:
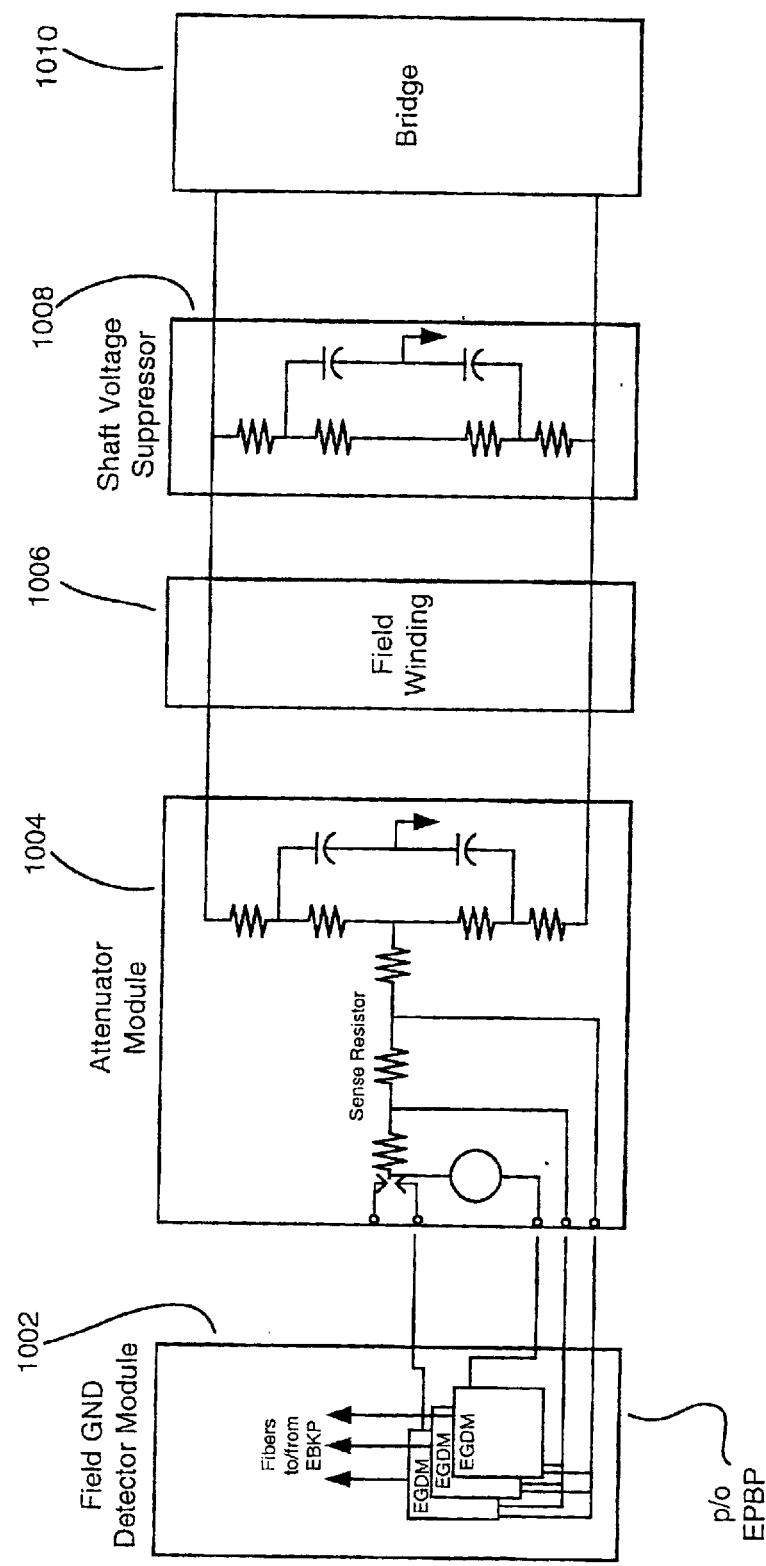
FIG. 10 shows a redundant field ground detector implementation of the present invention.

FIG. 10 illustrates a functional block diagram of an implementation which makes use of redundant techniques to enhance the reliability of the implementation when redundant controllers are used. The field ground detector module 1002 is connected to an attenuator module 1004, that forms an interface between the field ground detector 1002, that is a low-voltage module and the high-voltage sections composed of a field winding section 1006, that is the field generator that produces the main flux in the generator, a shaft voltage suppressor 1008, that is used to protect the field generator from commutation spikes, and a bridge 1010 which is a power electronics section that contains thyrsitors that convert AC input into DC. The field ground detector 1002 contains redundant oscillators that are controlled by Master 1 and Master 2, respectively. Isolated power supplies that receive their power from Master 1 and Master 2 power these oscillators. Master 1 and Master 2 command these oscillators to go to either the positive or negative state. The protection controller makes the decision which master will be in control and selects the appropriate oscillator through a relay contact. All three controllers measure the oscillator voltage during the first 200 msec after a transition, and then measure the voltage across the sense resistor for the remainder of the half cycle. This permits voting of measured signals so that single point failures will be detected and eliminated from the output.

The protection controller uses polled/voted signals to decide when to transfer control to the other Master's oscillator. Logic in each master channel of the field ground detector determines when to use a single ended measurement verses a differential measurement. This information is then passed to the other master and the protection controller so that these units can perform measurements at approximately the same time as the master controller in charge. All three controllers are therefore loosely synched to the master in charge. Selection of which master is in charge is performed through the protection controller, C3. This can be performed manually using the operator interface. Alternatively, this can be performed automatically upon the detection of a failed oscillator.

Figure 11:
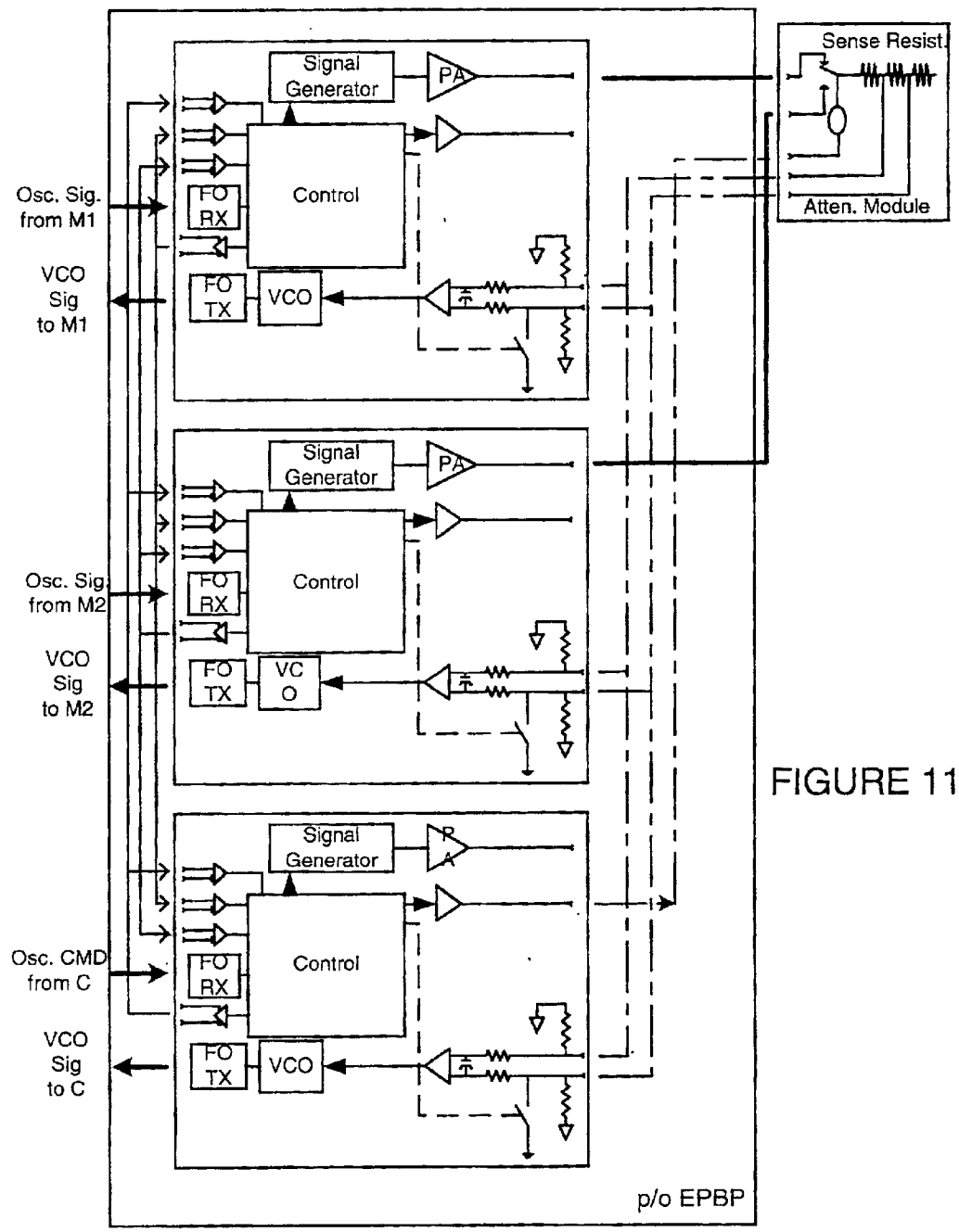
FIG. 11 shows a redundant field ground detector.

FIG. 11 illustrates signals used by each redundant field ground detector module as well as interconnection from the field ground detector module to the attenuator module and between each field ground detector module.

Historically, field ground detectors have included a test function to determine if the unit is operational. This has been performed in the past by disabling the trip function and installing a test resistor from the output of the oscillator to ground. The present solution described herein provides for automatically measuring the oscillator voltage on each half of the oscillator cycle. This provides a diagnostic indication of the health of the oscillator, power supplies, and fiber optic links. To verify that the ground detector can correctly measure the differential voltage across the sense resistor, a diagnostic test is provided. When test mode is selected, all three field ground detector modules (when redundant) are commanded to be in test mode. The oscillator frequency is selected to be a non-operational frequency, e.g., 2.5 Hz. The logic shown in FIG. 5 is used to detect the non-normal commanded oscillator frequency and force the VCO to measure the differential voltage across the sense resistor for the duration of the test. The ac circuit formed by the attenuator and associated filter capacitors and the shaft voltage suppressor permits significant flow of current at the 2.5 Hz test frequency resulting in a signature test of the field ground detector, as illustrated in FIG. 9. When redundant field ground detection is used, the channel associated with M1 is tested first and then the channel associated with M2. The field ground detector is assumed to have passed the test if both channels are tested and determined to be acceptable. For non-redundant applications, only one field ground detector channel is provided, and that channel is tested using the non-normal test frequency and signature analysis.

One example of software/code that may be used in implementing the field ground detector functionality is provided in the Appendix. For black start gas turbine applications, the field is flashed at 50% speed and maintained at a level to maintain constant Volts/Hertz on the generator. For this reason, the algorithm for detecting an AC ground fault is preferably able to work from 50% speed up to rated speed. The algorithm detects an AC ground fault by measuring fundamental frequency voltages in the sense resistor. A DFT is implemented with the sine and cosine generators locked to generator frequency so that the DFT will track generator frequency during the start up from 50% speed. An AC ground fault is declared only if the fundamental frequency component of sense voltage as detected by the DFT exceeds 0.75 vrms. Each channel (M1, M2 & C3) requires the following input signals: voltage across the sense resistor; time of transition of oscillator to next level; average generator field voltage; oscillator voltage; test mode command; and reset command. In addition to the above signals, controller C3 requires a command to transfer to the other master's oscillator.

The VCO signal from each Field Ground Detector module is passed through a three-stage low pass digital filter. In one particular arrangement, three stages of low pass filtering at 31.4 radians/sec are required in order to remove the fundamental frequency component of an AC ground fault from the average voltage across the sense resistor while maintaining adequate speed of response. The output of the first stage of filtering is used to measure the oscillator voltage 200 msec after a command to transition to the next oscillator level is made. The output of the single 31.4 radian/sec. filter is within 0.2% of its final value 200 msec. after a step in oscillator voltage. A command to go to the next oscillator level is sent from the master in control (or from the single control in a non-redundant configuration) over the fiber optic link to the field ground detector module. The logic in the field ground detector module will force the sense resistor measurement to be with respect to ground for 250 msec after the command to transition is given. The field ground detector algorithm will wait 200 msec after the command for the next oscillator level and then sample the VCO feedback from the field ground detector module. This is an attenuated signal proportional to the measured oscillator voltage and is used by the field ground detector algorithm as a diagnostic for the oscillator and VCO measuring circuits and to improve the accuracy of the ground detector algorithm.

If redundant ground detectors are supplied then the attenuated oscillator signals are voted and the voted value used in the algorithm. The field ground detector module automatically switches to a differential measurement across the sense resistor 250 msec after the command is given to change oscillator states and remains in the differential mode for the rest of the 2.5 second half cycle. The field ground detector algorithm waits for 2.4 seconds after the command to switch levels is given and samples the output of the filtered voltage across the sense resistor. The filtered generator field voltage is also sampled as well as the DFT of the unfiltered sense voltage. If redundant controllers are used, then voted signals are used for all field ground detector signals. The ground fault resistance is calculated according to Equation 7.0, restated as the following equation:

$$Rx = \{A*(Vsp*Vfgn/Vfgp-Vsn) - B*(Voscp*Vfgn/Vfgp-Voscn)\} / \{C*(Vsn-Vsp*Vfgn/Vfgp) + D*(Voscp*Vfgn/Vfgp-Voscn)\}.$$

In this equation:

$$A = 2*R*Rb^2*Rs + R^2*Rb^2,$$

$$B = 2*R*RsRb^2,$$

$$C = 2*RbR^2 + 4RRbRs + 2RRb^2,$$

and $$D = 4RRbRs.$$

Vsp is the attenuated sense voltage when the oscillator is positive. Vsn is the attenuated sense voltage when the oscillator is negative. Vfgp is the attenuated field voltage when the oscillator is positive. Vfgn is the attenuated field voltage when the oscillator is negative. Voscp is the attenuated oscillator positive voltage and Voscn is the attenuated oscillator negative voltage. Note that Vsp, Vsn, Vfgp, Vfgn, Voscp and Voscn are all measured quantities while A, B, C, and D are calculated from the resistors that make up the attenuator, the sense resistor and bleeder resistors in the shaft voltage suppressor, fixed for a given implementation. When the unit is not energized, i.e., field voltage is zero, the ratio of Vfgn/Vfgp is unity and the equation for the ground resistance becomes:

$$Rx' = \{A*(Vsp-Vsn) - B*(Voscp-Voscn)\} / \{C*(Vsn-Vsp) + D*(Voscp-Voscn)\}.$$

The actual magnitude of the ground resistance can be calculated with the unit energized or non-energized. Once the ground resistance is calculated, then (if the unit is energized) the location of the ground fault is estimated using either Equation 8 or Equation 9.

The other function of the algorithm is to perform a signature test to verify that the detector can properly measure the differential voltage across the sense resistor. Changing the oscillator frequency to a non-operational frequency, 2.5 Hz, performs this test. Significant ground current flows through the filter capacitors associated with the field ground detector attenuator network and through the capacitors associated with the shaft voltage suppressor. The algorithm makes use of this fact to perform a signature test of the field ground detector.

The signal from the sense resistor is passed through 3 stages of low pass filtering, used for normal operation of the detector. The output of the cascaded low pass 31.4 radian/sec filters is then passed through a high pass filter set for 12.563 radians/sec to remove the DC component. The output of the high pass filter is passed through an absolute value circuit which provides full wave rectification of the signal and then filtered by a 2 pole low pass filter with breaks at 1 radian/sec. This average signal is proportional to the quantity of 2.5 Hz signal available in the sense resistor measurement.

This signal should vary no more than 25% from a nominal value even when the test is performed with a preexisting ground fault. Measured sense resistor signals that differ more than +/−25% from an expected value will be considered a failure and will result in the field ground detector declaring itself unhealthy. Note that this test includes the attenuator and shaft voltage suppressor functions and therefore checks devices that are not just associated with the field ground detector. For redundant applications, the algorithm checks the channel associated with Master 1 first and then checks the channel associated with Master 2. For redundant applications, both channels must pass before the test is considered passed.

Figure 12:
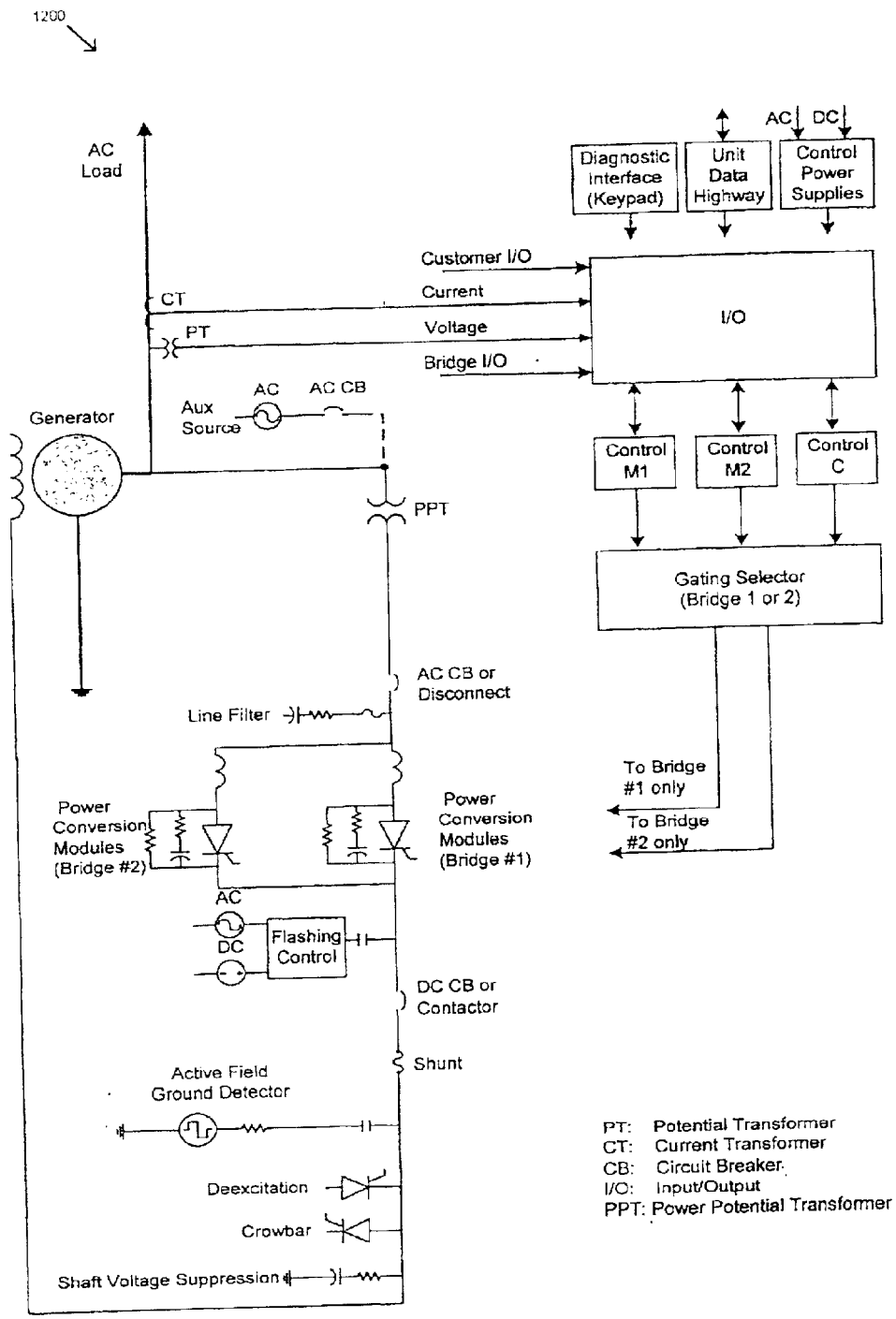
FIG. 12 is a schematic diagram illustrating a static excitation control system incorporating the field ground detector of the present invention.

Referring now to the schematic diagram of FIG. 12, which illustrates a static excitation control system incorporating the field ground detector of the present invention. It should be understood that this description is but one example of an application in which the field ground detector of the present invention may be employed. For instance, one other example of a useful application is in related regulator applications.

The field ground detector of the present invention is depicted in FIG. 12 and described as follows for use in the excitation control system for operating generators, such as used in steam, gas, and hydro generation. An example of an overall control system 1200 is represented in the schematic drawing of FIG. 12. The system may be fully or partially digital and may be provided in any of a number of configurations. The system may be communicatively coupled for access and control via any of a number of known networks, e.g., Ethernet, Internet, LAN, WAN, etc., and in hardwired or wireless fashion.

The control system 1200 is depicted herein as a digital excitation system and may be configured to provide flexibility for full static excitation systems. Fully static excitation based systems can support potential (voltage only) or compound (voltage and current) source. For fully static excitation systems, the control system 1200 may be provided in a simplex (single channel) control and power bridge or in a redundant (warm backup) control and power bridge architecture with protection module included.

The architecture of a simplex system, for example, includes one control rack (consisting of one master controller (M1)), customer interface sub-system, operator interface device, control power input module and one power module, consisting of bridge interface sub-system, power bridge, ac and dc filter networks, and ac and/or dc isolation devices. The control system 1200 can support ETHERNET LAN communication interface to, for example: 1) system toolbox functionality for configuration; 2) a turbine control system, such as the Mark VI offered by The General Electric Company of Schenectady, N.Y. (GE), and the GE HM1 interface using EGD protocol; 3) The GE Static Starter; and 4) The GE OnSite center to support remote system diagnostics. The control system 1200 can also support a RS-232 ModBus interface to a customer DCS control system.

The control system 1200 may include a powerful diagnostic system and a control simulator to support fast installation, tuning of control constants, and training.

Referring now to the digital controller (Thyristor based controls) of the control system 1200, a control module, M1, contains processor cards with associated I/O boards to process the application software. The control system 1200 includes a card rack having, for instance, space for one (M1), or three (M1, M2, and C) control modules. M1 and M2 may be identical controllers with one or more processor cards and associated I/O boards. The C controller also has a processor card with associated I/O boards.

Figure 13:
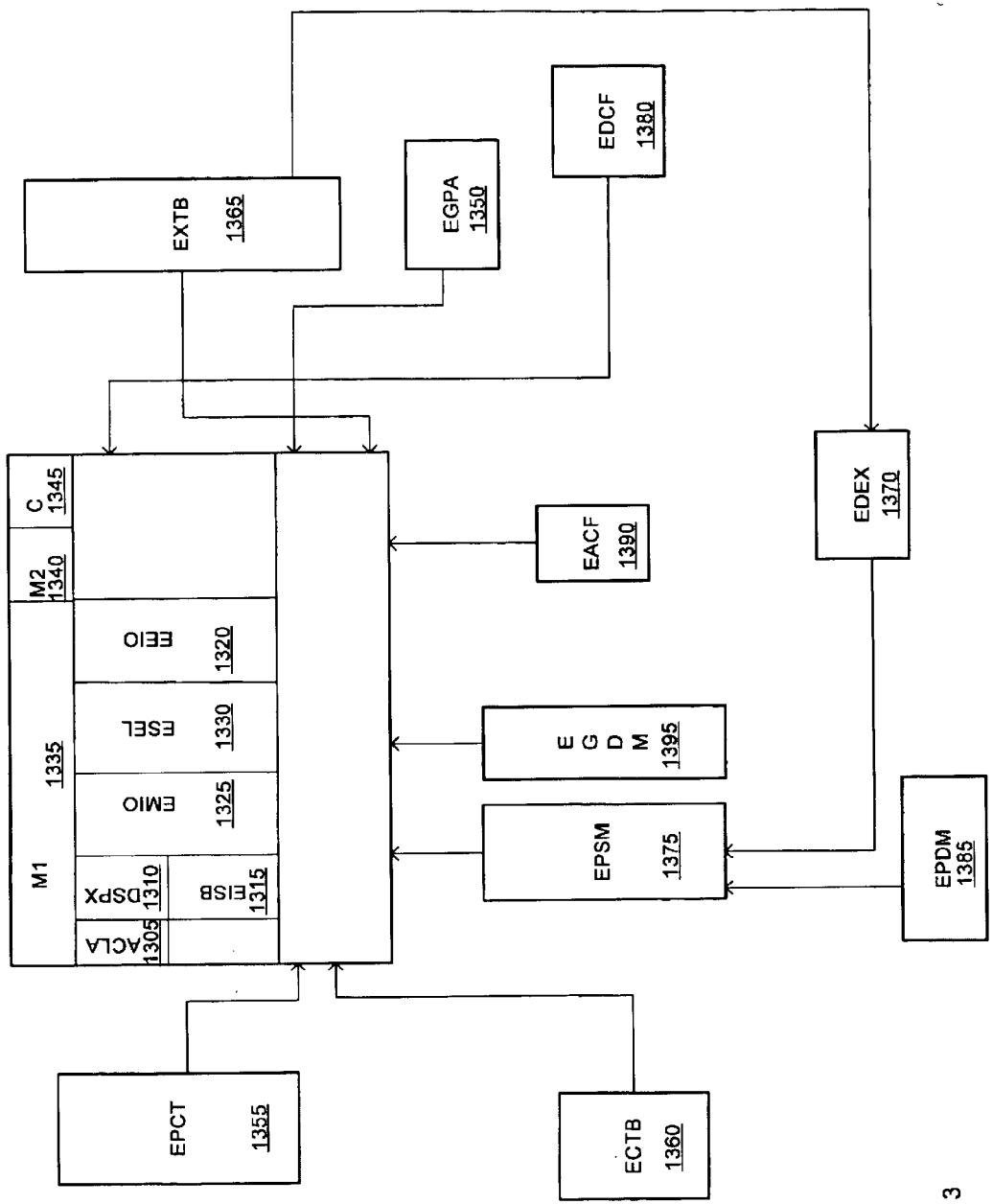
FIG. 13 is a schematic diagram illustrating the interconnection between a controller module with other input/output modules of the present invention.

In one configuration, and in reference to FIG. 13, each controller module assembly contains up to six boards: the main processor board—Application Control Layer Card (ACLA) 1305, the digital signal processor board (DSPX) 1310, ISBus communication board (EISB) 1315, and three I/O boards (EEIO 1320, EMIO 1325, and ESEL 1330). These boards are interconnected through a Versa Module Eurocard (VME) style backplane and are cabled together to their associated I/O termination boards.

The Application Control Layer Module (ACLA) is a scaleable microprocessor-based controller, used for communication and control in the control system 1200 exciter. The ACLA mounts in a VME style rack and occupies two half-slots. The ACLA is a PC-based, scaleable, digital controller and is one of two programmable cards that populate the control system 1200 card rack. The other is the DSPX card. By way of example, but not limitation, the ACLA may be based on a 486 type processor operating at 100 MHz, supporting 8 megabytes of dynamic random access memory and a 4 megabyte flash memory BIOS. The ACLA may be used as a communication gateway to external machines and as an outer loop controller/regulator.

The communication gateway functions may include: Ethernet Port to support one or more interfaces; Ethernet Global Data link to turbine controls, Human Machine Interfaces, static starter, etc.; Modbus via Ethernet using TC/IP protocol; Control System ToolBox software; Serial (RS-232) Port to support; Control System ToolBox Flash programming; ModBus over RS-232 data link; and Dual Port Memory (DPM) interfaces with the DSPX programmable card. The Outer loop control/regulator functions may include: Setpoint controller for the Auto and Manual regulators; Var or PF control; Limiter Functions; Power System Stabilizer; Field Temperature Calculation; and Balance Meter.

The Digital Signal Processor board (DSPX) is the primary controller for inner loop control/regulators and local operator interface control supporting testing and setup. For example, the board may be based on a high speed, 60 MHz, digital signal processor chip supporting 248 kilobytes of high speed static random access memory and a 512 kilobytes flash memory BIOS. Inner loop control/regulator function may include: Field Voltage regulator; Field Current limiter; Sequencing of start-stop, field flashing, alarms and trips; Generator instrumentation processing; and Generator simulator.

Local operator interface control functions use a serial interface to a keypad and display unit mounted on the door of the control system 1200 control enclosure and may support the following exemplary functions: Display and changing of internal control data and alarm and status information from the DSPX or its paired ACLA controller; and Display and change of live data to support commissioning, tuning, and troubleshooting.

The Exciter ISBus Board (EISB) is a communication interface board for the MI, M2, and C control modules. The board provides, for example, a 5 megabit per second ring bus communication between controllers M1, M2, and C via the control system 1200 backplane that is based on a transformer coupled RS-422 standard. It receives and transmits (through fiber optic cable) feedback signals from the generator field voltage and current signals, the exciter voltage and current signals, and the ground detector voltage modules. It then interfaces them via the backplane to the DSPX controller. Communications between the DSPX and the configuration tool and keypad ports using RS-232 is also supported.

The EMIO Master I/O board handles the I/O from the EPCT, ECTB, and EXTB termination boards. This I/O include PT and CT signals, contact inputs, output relay drivers, and pilot trip relay drivers for flashing, DC breaker contactor close function, and de-excitation. It also sends logic level gate pulse signals via the backplane to the ESEL board.

In one configuration, the Exciter Selector board (ESEL) 1330 is controlled by six logic level gate pulse signals from the EMIO, one for each bridge SCR. ESEL generates six gate pulse signals that are cabled to the EGPA board 1350 which directly control the six SCRs on that bridge. ESEL is capable of controlling up to six bridges in a multi-bridge exciter. If there are redundant controls, two ESEL are used, one driven by M1 1335 and the other by M2 1340. The active ESEL is selected by module C 1345, and sends the selected control signals to the EGPA board.

The exciter PT (Potential Transformer)/CT (Current Transformer) termination board (EPCT) 1355 contains transformers for critical generator voltage and current measurements. Three-phase generator voltage inputs support two channels of generator voltage feedback data from the generator or one from the generator and one from the line side of the sync breaker. Two generator current inputs, with current levels of 1 A or 5 A, are brought into two current transformers to support one channel of generator current feedback data. All the transformer output signals are cabled to the EMIO board in the control rack. In addition, one analog input, which can be either ±10 volt dc or 4–20 ma current, is brought into EPCT. The EMIO board performs an analog to digital conversion on all PT, CT, and analog input signals at 2000 samples per second. The resulting generator current and voltage measurements are within 0.25% of actual reading. High frequency noise suppression near the point of signal entry is provided on all input signals to EPCT.

Generator voltages from the potential transformers are wired to TB1. The cable lengths are a consideration and, in one example, can be a maximum of 1000 ft of #12 AWG wire. The generator PT secondary outputs are nominally 115 Vrms at 50/60 Hz and are fused. Generator voltage inputs are magnetically isolated with a 1500 Vrms. barrier.

Two generator current inputs from current transformers are wired to non-pluggable terminal blocks that support ring terminals. The cable length from the transformer to the EPCT board can, for example, be a maximum of 1000 ft. with a wire gage of up to #10 AWG. The current inputs are magnetically isolated with a 1500 Vrms. barrier. EPCT supports a non-isolated analog input with a voltage range of ±10 Vdc, or a current range of 4–20 ma. The cable length can, for example, be up to 300 meters with a maximum two-way cable resistance of 15 ohms.

The Exciter Contact Terminal Board (ECTB) 1360 supports relay outputs and contact inputs. There are two versions; a redundant mode version and a Simplex mode version. Each board contains, for example, tow trip rated relay outputs that can operate a customer lockout relay, controlled by the EMIO board. There are also four general purpose Form-C relay outputs available, also controlled by the EMIO board. The four general purpose relay dry contacts are, for example, rated 125 Vdc nominal (250 Vdc max, 24 Vdc min) for resistive load of 2 A at 28 Vdc or 0.5 A at 120 Vdc or for an inductive load of 1 A at 28 Vdc or 0.1 A at 120 Vdc for a load with a 0.007 s (L/R) time constant.

Eight auxiliary contact inputs are monitored, by optocoupler circuits and powered by ECTB. Two of the eight contact inputs are dedicated contact inputs to monitor the generator breaker (52G) status and customer generator trip (86G). The optocoupler for the 86G contact is located on the EMIO board, not on the ECTB. 70 volt dc power for the contacts is supplied by the M1 power supply or, on redundant systems, also from the M2 power supplies The Exciter Terminal Board (EXTB) 1365 supports pilot relay outputs, contact inputs, and signal conditioning circuits used internally by the excitation system. There are two versions of this board, one to support redundant systems and one to support simplex systems. Both versions cable to the EMIO boards where the relay drivers are located.

Pilot relays used to support the dc output and field flashing contactors are located on the board, plus trip relays for external field breaker applications and the de-excitation pilot relay. Crowbar status signals and de-excitation status signals from the EDEX board are conditioned on EXTB and sent to EMIO. Three status contact inputs, for the field contactor/breaker, and field flashing monitoring, are powered by 70 Vdc on EXTB. Optocoupler circuits monitor these contacts. On redundant system, the 70 Vdc power for the contacts is provided by the M1 and M2 power supplies. The resulting signals are sent to the EMIO.

The Exciter Power Supply Module (EPSM) 1375 converts 125 Vdc from the Power Distribution Module (EPDM) 1385 into the voltages required for the Exciter Control System's card rack. The EPSM module has, for example, two main sections: a buck regulator that takes the 125 Vdc input and supplies the input side of a multi-tapped switching isolation transformer, and a converter section that generates the +5, +15, −15, 24, and 70 Vdc power outputs. The Exciter Power Supply Backplane (EPBP) (not shown) power supply backplane board is used to mount and distribute the inputs and outputs to the EPSM board as well as house the field ground detector modules.

Each of the control sections M1, M2, and C may be provided with an independent power supply module. In one configuration, the control backplane (EBKP) rack (not shown) holds the control boards and is supplied with +5 Vdc, ±15 Vdc, and +24 Vdc by the EPSM. Power may be supplied to modules external to the EBKP as follows: ±24 Vdc to power the De-Excitation module, Crowbar module, Ground Detector, and the Field Voltage/Current module (EDCF); and Isolated +70 Vdc for "contact wetting" to the EXTB and ECTB boards.

The EPSM is a 6U VME form-factor board. Backplane connectors carry power from the power supply board to its card rack which then support the cables needed to source the Excitation Control System card rack backplane (EBKP).

Referring now to the Exciter Power Distribution Module (EPDM) 1385, control power can be acquired from a 125 Vdc source and one or two 115 Vac sources. The ac source is passed through an external ac/dc converter module. The resulting 125 Vdc is diode coupled with the other dc sources onto a dc bus on the EPDM board. The EPDM feeds the control modules and gate pulse amplifier boards. Outputs from the EPDM are fused, pass through switches, and have LED status indicators. AC power for the bridge cooling system comes from breakers included in the exciter.

The Gate Pulse Amplifier Board (EGPA) 1350 interfaces the control to the Power Bridge. The EGPA takes the gate commands from the ESEL and controls the gate firing of up to six SCRs (Silicon Controlled Rectifiers) in the Power Bridge. It also is the interface for current conduction feedback, and the bridge airflow and temperature monitoring. A nominal 130 Vdc power source supplies an on-board DC/DC converter, which provides the isolated power for SCR gating over the full range of input supply voltage. LEDs provide visual indication of the status of the output firing, currents into the bridge, power supply, line filter, cooling fan rotation, bridge temperature, and alarm or fault conditions.

The Exciter DC Feedback Board (EDCF) 1380 measures field current and field voltage at the SCR bridge, and interfaces to the EISB board in the control panel over a high-speed fiber optic link. The EDCF converts the field current and voltage into two frequencies that are sent over the fiber optic link at 10 MBd. The fiber optics provides voltage isolation between the two boards, as well as high noise immunity. Transformer coupling provides power supply up to 1500 V rms isolation on the 24 Vdc supply for this board. The field voltage feedback circuit provides seven selector settings to scale down the bridge voltage, depending on the bridge operating voltage.

The Exciter AC Feedback termination Board (EACF) 1390 contains, for example, transformers for a single three-phase voltage measurement, and terminals for two Flux/Air core coils. The outputs of the voltage and current circuits are fanned out to three connectors for cables to modules M1, M2, and C. High frequency noise suppression near the point of signal entry is provided for the flux/air core input signals. Cable shield termination screws attached to chassis ground are located within three inches of each set of input screws where applicable.

In one configuration, the Exciter De-Excitation Module (EDEX) 1370 is based on a free-wheeling diode and supports a non-inverting system. In another configuration, the EDEX is of a higher performance type based on a SCR and supports an inverting system. The EDEX used on high performance excitation systems typically includes the following features and capabilities. During shutdown of the generator, the energy of the generator field is dissipated. In the control system 1200 exciter, this is the function of the de-excitation module and field discharge resistor or inductor (when supplied). The de-excitation module consists of a thyristor (53 mm or 77 mm cell size) mounted in a large heatsink assembly with attached snubber network. The board includes conduction sensor functions and firing control functions and is mounted on the heatsink. The Conduction Sensor Function contains Hall effect sensors. The sensors are mounted in the air gap of a circular steel core attached to the board. They sense the magnetic field produced by the field discharge current flowing through the thyristor. Two independent sensor circuits are used.

The EDEX board also contains the Firing Control Function. The purpose of this board is to fire the SCR when either of two control inputs (M1 or M2) is true or when the anode to cathode voltage of the SCR exceeds a selectable value. The two firing control circuits on the board are powered from separate power supplies and use separate conduction sensors making them mutually independent. Feedback from either conduction sensor verifies that the discharge circuit has operated successfully. If both independent firing control circuits fail to fire, the SCR is fired by the anode firing circuit when the anode to cathode voltage has exceeded the selected level.

The de-excitation module used on standard performance excitations is similar to the high performance version. The SCR is replaced with a diode that is connected across the field. The diode conducts whenever there is negative voltage across the field. During normal operation of the power bridge, when the bridge tries to invert the field voltage the field current will freewheel through the diode. During a trip or a normal stop, when the field voltage inverts, the field current will freewheel through the diode. The conduction sensor function will report the conduction state of the diode back to the controls.

Now referring to the Power Control Module (Thyristor—SCR), which in one configuration includes a three-phase, full-wave, inverting thyristor (SCR) bridge, used as the standard power conversion module for control system 1200 digital exciters. The inverting bridge can provide both positive and negative forcing voltage for optimum performance. Negative forcing provides fast response for load rejection and de-excitation. Software changes of the firing circuits can be made to suppress negative forcing if it is not required for the system application. Negative forcing can not be supported when the freewheeling diode form of de-excitation of the Modules generator field is supplied. Each rectifier bridge includes thyristor protection circuitry such as snubbers, filters, and fuses.

The thyristor bridge assembly is normally forced-air cooled with convection cooling available for lower current applications. For most applications, redundant cooling assemblies are used, all normally energized during operation. Thermostats monitor the Power conversion module temperature. A set of Alarm and Trip Contacts can trigger an alarm at a high temperature level, and a trip at an even higher temperature level. Reactors are located in the ac legs feeding the SCRs. The snubbers are a RC circuit from the anode to the cathode of each SCR. The cell snubbers, line-to-line filters and line reactors together perform the following functions to maintain proper operation of the SCRs: limit the rate of change of current through the SCRs and provide a current "dump" to aid in starting conduction; and limit the rate of change in Voltage across each cell, and during cell commutation limit the reverse voltage that occurs across the cell. A software based conduction sensing Circuit monitors each SCR bridge for blown fuses, missing gate pulses, or open/shorted SCRs.

For most applications a field interrupting dc contactor in the rectifier field current bridge dc-positive output to connect the exciter to the generator field leads. The dc contactor and the EDEX module (SCR or diode based) together form the internal field breaker function found in previous excitation systems used to remove stored energy in the generator field during shutdown or trip events. Often, two dc contactors are provided to interrupt both the positive and negative field leads.

For some applications an external exciter field breaker is included DC field breakers interrupt the output of the exciter and use a shorting contact to de-excite the generator through a discharge resistor to remove stored energy in the generator field during shutdown. Some DC field breakers may use a static de-excitation device in place of the shorting contractor which is functional the same as the combination of a dc contactor and static de-excitation module.

Referring now to AC Isolation, for small to medium size systems an internal or external manual AC disconnect switch may be provided. This switch serves as a disconnect device between the secondary of the power potential transformer and the power bridge in the static exciter. In most cases it is a molded case, 3-phase, non-automatic, panel-mounted switch that is manually operated. This switch permits the customer to close and open the ac input supply. For larger systems an external AC disconnect breaker may be preferred. This switch serves as a disconnect device between the secondary of the power potential transformer and the static exciter. It may be a molded case switch or a vacuum breaker supporting remote control. This switch permits the customer to close and open the ac input supply.

A shaft voltage suppressor may be used to limit shaft voltage to ground (such as caused by thyristor commutation) to less than 5–7 V zero to peak. Shaft voltage, if not effectively controlled, can damage both journals and bearings. Excitation systems, which produce a dc voltage from ac through a solid state rectification process, cause ripple and spike voltages at the exciter output. Due to their rapid rise and decay times, these voltages are capacitively coupled from the field winding to the rotor body. This creates a voltage on the shaft relative to ground. The shaft voltage suppressor is a filter that conducts the high frequency components of voltages to ground. It is shipped loose (for mounting at the collector of the generator) in most large applications. For smaller applications, the shaft voltage suppressor is part of the main exciter lineup.

A Crowbar Module is particularly useful in Hydro Applications (salient pole generators) and some steam or gas applications (wound rotor generators). During a pole slip event (when the generator loses synchronism with the power grid), high voltages can be induced from the generator stator back on the generator field. This high voltage can damage the excitation system and/or the generator field if the induced voltage rises above destructive levels. The crowbar safely limits the induced voltage below the destructive level for the excitation system and the generator field.

In one arrangement, the hardware used to implement the crowbar function is the EDEX module with the thyristor direction changed. The load for the crowbar must be a resistor, but the resistor can be shared with the de-excitation function. The functionality of the crowbar, thyristor with snubber, and conduction sensor, are the same as for the de-excitation module. The crowbar's thyristor is turned on when the anode to cathode voltage of the SCR exceeds a certain value. Once the crowbar conducts, the reverse current induced by the pole slip event has a conduction path thus limiting the reverse voltage on the generator field and exciter output.

A Field Flashing Module supplies approximately 15% to 20% of no-load field current "AFNL" to the generator field during the start up sequence. Field flashing from a dc power source is the standard method of flashing, however, an ac field flashing module is also available. The dc field flashing module can be powered from either a 125 Vdc or a 250 Vdc station battery and has a maximum rating of 350 amps dc for 15 seconds. The ac field flashing control is almost identical to the dc field flashing control. However, in the ac field flashing control, the ac voltage is rectified by a diode bridge and filtered. The diode bridge also serves as a freewheeling diode circuit This panel accepts a 460 Vac single-phase input that is then stepped down to 27 Vac through a transformer. The panel is rated for a maximum of 350 A dc for 15 seconds.

The Field Ground Detector (EGDM) 1390 is described in more detail hereinabove. In the exemplary embodiment of FIG. 13, the EGDM is provided in an exciter system and detects field leakage resistance from any point in the field circuit, starting at the ac secondary windings of the input transformer through the excitation system and ending at the de generator field. The active detection system applies a low voltage with respect to ground and monitors current flow through a high impedance ground resistor. When peak reverse voltage (PRV) resistors are present, grounds anywhere in the system can be detected even while the exciter is not running (gating SCRs). Without PRV resistors, any ground on the ac side of the power bridges can only be found when the system is running.

As described above, the field ground detector of the present invention provides, among other things, the following benefits: constant sensitivity to grounds independent of operating voltages on the generator field; constant sensitivity to grounds without regards to ground location in the generator field; and detecting the location of field grounds. The ground detector voltage may be sent over a fiber-optic link to the EISB card for monitoring.

Now regarding redundancy (power Bridge-Warn Back-Up). For small to medium sized static exciters, power bridge redundancy is often desired and the total power needs of the generator field can be supported within one Power Conversion Module, the GE control system 1200 "Warm Backup" option is available. This "Warm Backup" offering uses redundant controls (M1 and M2 Controllers with the C Controller) with two full wave SCR bridges that share a common ac input and dc output circuits.

The active power bridge receives the gating commands from the active control (M1 or M2) and supports the full field voltage and current needs of the generator field while the backup power bridge's gating circuit is inhibited. The operator has full control to select which of the redundant power bridges is active or inactive. Bi-directional bumpless transfer between active and inactive bridges is supported. Sophisticated monitoring and protection circuits: detect a failure or improper operation of the active power bridge; delay transfer (if needed to clear and SCR leg fuses); and activate the inactive power bridge without operator intervention. The "Warm Backup" configuration is a cost-effective way to obtain N+1 bridge redundancy when N=1.

Now regarding control only redundancy. When only control redundancy is required, the control system 1200 may provide two (M1 and M2) controllers with the C Controller with Simplex rectifier bridge. The control redundancy will use the M1 Controller as the primary control and the M2 Controller as a backup to the primary controller with the C Controller to implement protection and primary/backup transfer functions. The three controllers use the high speed ISbus to connect the hardware Fault Tolerance (SIFT) and software functions between the independent Master Controllers and the C Controller. The controller redundant configuration is a cost-effective way to obtain true control redundancy since there are: redundant set of controls including both automatic and manual voltage regulators; redundant control power supply; and redundant system software Now regarding remote Input/Output Option. The control system 1200 can be communicatively coupled or connected with other data acquisition, monitoring equipment (SCADA, PLC, etc.), such as GE's VersaMax™ I/0 subsystem, which can be interfaced to the control system 1200 using, for example, a high speed Ethernet interface via the Master controllers (M1 and M2).

Now regarding operator console (Remote/Local) option. An operator interface, such as a keyboard, console, voice recognition system, etc., may be, for example an embedded PC-based system using a LCD display that supports graphical and character displays using a touch-screen interface. Configuration will be supported using the control system. "ToolBox" software may be used to interface with the exciter control hardware and software. Multiple displays for running and displaying data, alarm, status, diagnostics, etc., may be supported. Remote (e.g., on the operator control console) or local (e.g., on the door of the exciter) options may be supported.

Now referring to a diagnostic interface (e.g., keyboard). A keypad may serve as a local operator interface and may be mounted on the cabinet door associated with the exciter control system. Start/stop commands, regulator transfer commands, and regulator selection can be issued from the keypad. The keypad also includes meter displays indicating system conditions such as generator MW and MVARS, field current and voltage, and regulator balance. Diagnostic displays, such as the alarm history, setup, application data, and I/O interface displays, provide system information for service personnel.

The functionality achieved by the control system 1200 and peripheral equipment may be accomplished by a combination of hardware and software. Field equipment, such as sensors, relays, drive units, controllers, etc., may be joined in the overall system and may provide data in to the system in analog or digital form or may be controlled such as by analog or digital outputs from the control system or associated equipment.

Figure 14:
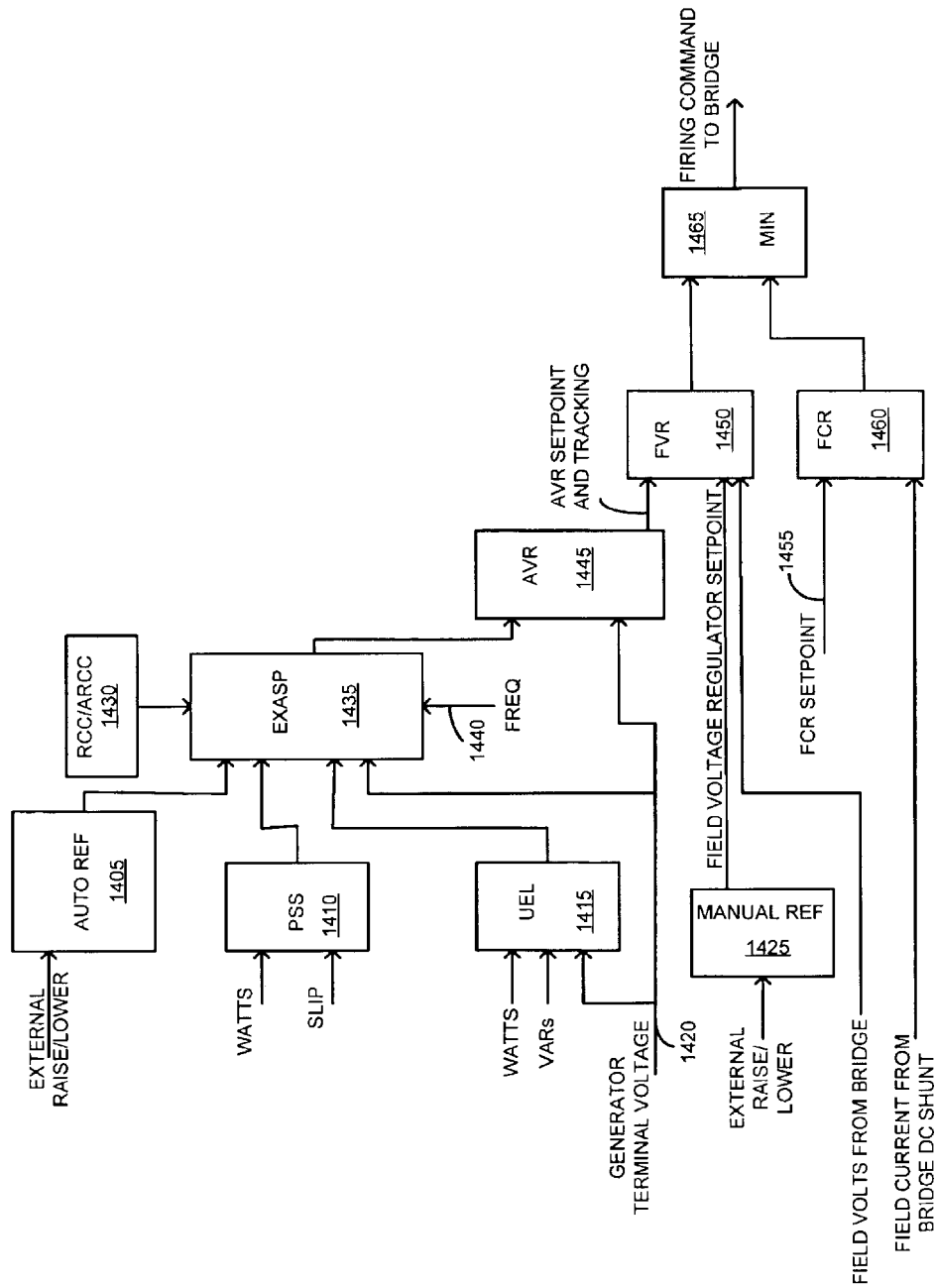
FIG. 14 is a software-based transducer system flow implementation according to an embodiment of the present invention.

In reference to FIG. 14, one important function of the excitation system is the transducering system, often primarily software implemented. The generator PTs and CTs are the source of the control signals needed by the automatic (generator terminal voltage) regulator, most limiters, and protection functions. In one manner, a transducer may be provided that, unlike more traditional generator transducers, simultaneously samples the ac waveform at high speed and in software uses mathematical algorithms to digitally generate the variables needed. For instance, the output of the software transducer system could include the following: Generator Voltage—the average generator output voltage; Generator Active Current—the average generator output current that is in phase with watts; Generator Reactive Current—the average generator output current that is in phase with reactive (imaginary) power (VARs); Generator Frequency—the current operating frequency of the generator; Slip—a signal representing the change in the rotor speed. The software base transducer system may use the above to calculate the following: Generator Power and VARs; Magnitude of generator flux (V/Hz); and Phase Angle and Power Factor.

An Auto Regulator Reference (AUTO REF) block 1405 generates the auto control (AC) setpoint variable for the Automatic Voltage Regulator (AVR). Operator commands, (raise and lower inputs) come in from direct inputs or over a data link from an human-machine interface (HMI) operator station or from a plant DCS or remote dispatch system. This block can be configured with upper and lower limits, presets, and up/down ramp times.

An Manual Regulator Reference (MANUAL REF) block 1425 generates the manual setpoint variable for the Manual Voltage Regulator (MVR). Operator commands, (raise and lower inputs) come in from direct inputs or over a data link from an human-machine interface (HMI) operator station or from a plant DCS or remote dispatch system. This block can be configured with upper and lower limits, presets, and up/down ramp times.

In addition, Automatic and Manual Reference Follower (Tracking), may be provided. The software implemented functions adjust the non-active regulator output to automatically track the active regulator. That is, when the auto regulator is controlling the generator the manual regulator will track and when the manual regulator is in controlling the generator the auto regulator will track. This will provide for smooth transition when a transfer occurs from one regulator to the other.

The Exciter AVR Setpoint (EXASP) block 1435 combines a number of functions to produce the reference input to the Automatic Voltage Regulator 1445 and the variable to support regulator tracking. The reference output from this block is, for example, a summation of the following: the stabilizing signal from the PSS Block 1410; the output of the AVR REF block 1405; the limiter signal from the UEL block 1415; the output from the RCC/ARCC block 1430; the combination of Frequency and Generator voltage to generate the V/Hz limiter signal 1420; an external test signal 1440 to support injection of white noise and step test signals.

The Under Excitation Limiter (UEL) 1415 is an auxiliary control to limit the automatic voltage regulator demand for underexcited reactive current or power. The UEL prevents reductions of the generator field excitation to a level where the small-signal (steady state) stability limit, or the stator core end-region heating limit is exceeded. Performance is specified by identifying the region of the limiter action on the generator capability curve.

The Reactive Current Compensation (RCC/ARCC) function 1430, when in the Reactive Current Compensation (RCC—droop) mode permits sharing reactive current between paralleled machines. When in the Active Reactive Current Compensation (ARCC—line drop) mode, it enables "line drop" for regulating at some point remote from the generator terminals.

The Volts per Hertz Limiter (V/Hz Lim) 1420 function acts to reduce an unacceptable volts per hertz ratio to the maximum continuous rating of the generator. This functions uses two inputs from the software transducer, average generator voltage and generator frequency, and its V/Hz ratio is configurable. The generator is considered to be operating acceptably within ±5% of rated terminal voltage at rated frequency.

The Automatic Voltage Regulator (AVR) function 1445 of the AVR is to maintain the generator terminal voltage constant over changes in load and operating conditions. The error value (average generator voltage minus the composite reference output from the EXASP block) is the input to a proportional plus integral (PI) regulator with integrator windup protection. In most applications, AVR control output directly controls the firing command generator which control the gating of the power bridge SCRs when the AVR is enabled. On some applications that require an inner loop regulator, such as compound (voltage and current sourced) exciters and some high ceiling exciters, the Manual Regulator will use the control output from the AVR as a setpoint input.

The Power System Stabilizer (PSS) 1410 provides an additional input to the automatic regulator to improve power system dynamic performance. Many different quantities may be used by a PSS, such as shaft speed, frequency, synchronous machine electrical power, accelerating power, or some combination of these signals. The PSS offered in the control system 1200 is a multi-input system using a combination of synchronous machine electrical power and internal frequency (which approximates rotor) to arrive at a signal proportional to rotor speed. This comes from the integral of accelerating power, but with shaft torsional signals greatly attenuated.

A Stator Current Limit (SCL) function is used when the generator stator current exceeds the rate value. Upon the occurrence of this condition, the exciter will change from AVR control to a VAR control that is preset to a minimal stator current value. Once the stator current is less then the rated value, the exciter will return to AVR control.

The Manual Regulator (FVR 1450 or FCR 1460) function of the manual regulator is to control the generator field voltage or current thus letting the generator output voltage vary as a function of the flux level in the field, speed of and load on the generator. The manual regulator, like the AVR, use a proportional plus integral (PI) regulator with integrator windup protection and its control output directly controls the firing command generator that control's the gating of the power bridge SCRs when enabled. There are two inputs, the setpoint or reference input to the manual regulator and the generator field feedback.

For most applications the manual regulator setpoint or reference input will only come from the MANUAL REF block and will only be in control of the power bridge when selected by the operator or after a control transfer. For applications that require an inner loop regulator to be used with the AVR, when the AVR is in control of the generator, the setpoint input will come from the AVR control output.

The generator field feedback indicates the type of manual regulator. The Field Voltage Regulator (FVR) is the typical manual regulator supplied on most applications and uses the generator field voltage as the feedback input. FVRs permit the current to vary as a function of the field resistance. The Field Current Regulator (FCR). This is a special application of the manual regulator and uses the generator field current as the feedback input. While it does regulate constant field current over varying field temperature, GE has not selected the FCR as its standard manual regulator because it inhibits the signal independence from the over excitation limiter.

An over-excitation limiter (OEL) function is to protect the generator field from damage by events that would require abnormally high field currents. These high currents, over an extended time, can overheat the field thereby causing damage. Generator fields may be designed to ANSI Standard C50.13, which specifies the over voltage as a function of time that the field is designed to follow. This standard uses curves to describe the field overheating as a function of time and current. The OEL may be designed to approximate the curve of field voltage versus time.

The OEL interfaces directly with the power bridge firing command generator, therefore, it can protect the generator field from damage in either automatic or manual regulator mode. The function is not active under normal operation condition. This allows the exciter to respond to any generator fault condition without current limit for a time period of about one second. After this, a two stage current limiter is activated. The first stage normally limits the current to a high value. The thermal load into the field is integrated, using the known heating time constant of the field, until reaching the field limit. At this time, the current limiter will transfer to the lower limit. When the event is over, the integrator will discharge based on the cooling time constant of the field, which is slower than the heating time constant.

The current limit values are selectable base on the operating mode of the generator. When the generator is off-line, the off-line limits are used, and when the generator is on-line, the on-line limits are used.

A Hydrogen Pressure/Temperature Limiter Compensation feature compensates the configuration parameters of key generator limiters and protection functions based on generator cooling. The intent of this function is to correlate limiter action to the valid generator capability curves. For hydrogen cooled generators the correct parameter is the internal hydrogen pressure and for air cooled generators it is air temperature. In ether case, the exciter uses a 4–20 ma input to capture the parameter. Three limiters affected by pressure/temperature compensation are: Under Excitation Limiter (UEL); Over Excitation Limiter (OEL); and Stator Current Limiter.

Entering the parameters of three generator capability curves configures compensation. Software in the exciter control system extrapolates this data into an infinite number of curves needed to translate the present operation condition of the generator into the correct limiter configuration parameters.

The A Manual Restrictive Limiter feature limits the under-excited operation of the exciter while the Manual Regulator is selected (FVR or FCR). It also does not allow the Manual regulator to track the Automatic regulator when the unit is operating below the field voltage called for by the Manual Restrictive Limiter but still operating in the AVR mode.

A VAR/PF Control function is accomplished by slow ramping of the AVR reference setpoint. The VAR/PF is selected by operator command and the var/pf value is controlled using, for example, raise/lower push buttons.

A Generator Simulator (GEN SIM) for generating a detailed model may be included as part of the excitation system software. This module can be configured to closely match the operation of the real generator and be used for operator training and can support the checkout of regulators, limiters, and protection functions without being connected to the generator.

A Unit Data Highway Interface (UDH) connects the exciter with a generator control system, such as a turbine control system, e.g., GE's Speedtronic™, Human Machine Interface (HMI) or HMI ViewerData Server, and GE Fanuc PLC controls. The UDH is based on Ethernet Global Data (EGD) protocol. The UDH provides a digital window into the exciter through which all pertinent variables can be monitored and controlled. Also support on this link is the interface to GE's Control System ToolBox configuration and maintenance tool for the exciter.

In addition, the exciter can support a ModBus RTU slave data link to interface with customer DCS systems. This link can be based on RS-232 or use TCP/IP support over Ethernet 10baseT hardware. Both commands and data can be supported.

A The Volts per Hertz Protection function serves as a backup to the Volts/Hertz limiter and can be supported with or without the C (protection) controller. The protection scheme consists of two levels of volts per hertz protection— one level is set at 1.10 per unit over volts per hertz with an inverse time period and the other level is set at 1.18 per unit with a 2 second time period. Both trip and time setpoints can be adjustable.

A Over Excitation Protection (OET) function serves as backup to the Over Excitation Limiter and can be purchased separately from the protection module. If an over-excitation condition should occur which the limiter can not correct, then a trip signal is produced. This function approximates the curve of field voltage versus time defined in ANSI Std. C50.13.

A Generator Overvoltage Trip function monitors the generator armature voltage and will initiate a trip signal upon detecting an unacceptably high voltage.

A Potential Transformer Fuse Failure Detection (PTFD) function detects loss of PT feedback voltage to the voltage regulator. If the sensing voltage is lost or if it is single-phased, there is a transfer to the Manual regulator and an alarm output is provided. If the Power Potential Transformer (PPT) is fed from an auxiliary bus instead of the generator terminals, then a second set of PT signals must be supplied to independently monitor the generator terminal voltage.

A Transfer to Manual Regulator upon Loss of PT function detects loss of PT feedback voltage to the AC voltage regulator. If the sensing voltage is lost the regulator will force its output to ceiling for 0.5 seconds and then transfer to Manual. This is distinctly different from the PTFD function which does not force the regulator to ceiling before transferring.

A Loss of Excitation Protection function detects a loss of excitation on Synchronous Machines. This is an impedance relay function that is implemented in software. This function can be used to satisfy recommended settings and can accommodate separate relay characteristics. The function is performed within software code and can accommodate offset settings and two diameter settings. The offset settings, for instance, may be equal to one-half the machine transient reactance ($X'd/2$); the small diameter setting is equal to 1.0 per unit on the machine base, and the large diameter setting is equal to the machine synchronous reactance (Xd). The small diameter setting has no time delay and the large diameter setting has an adjustable time delay.

Each of the two relay characteristics are independently adjustable (offset-diameter-time delay) and can be used to initiate a TRIP signal. The use of two relay characteristics may be used to address concerns about the performance of the voltage regulator when it is operating on the "under excited limit." The regulator may undershoot while trying to maintain the limit and cause the apparent impedance to momentarily enter the relay characteristic. If only one relay characteristic is used (small diameter), there may be undesired operation as a result of any regulator undershoot. Using the large diameter setting with time delay helps to avoid this problem with undershoot.

A Exciter Phase Unbalance (EUT) function monitors the secondary voltage from the three phase input power potential transformer. If a voltage phase unbalance condition exists, an alarm is generated, and a trip signal is initiated after a time delay.

An Off-Line Over Excitation Protection (OLOT) function serves as backup to the Over Excitation Limiter when the generator is off-line. If the generator field current exceeds 120% of no-load field current while operating off-line, in either the automatic regulator or manual regulator mode, and the limiter can not correct an over-excitation condition, this function will initiate a trip signal after a time delay.

A Generator Field Temperature Calculation feature measures the resistance by dividing the field voltage by the field current. From the known field resistance at 25° C. and the linear resistance temperature change in copper, the algorithm calculates operating temperature. An adjustable high temperature alarm output contact is also included.

Although the embodiment of FIG. 12 focused on the application of the field ground detector with static exciters, this inventive concept can be used to detect grounds in any of a number of applications, including on the generator field in regulator applications. For example, a regulator that excites the field of a rotating exciter or the control winding of a saturable transformer furnished as part of a compound static exciter. An important aspect is to provide access to the generator field winding to ensure effective system operation. With a static exciter, an EXAM card is used to interface between the ground detector module and the field winding. An EGDM card is utilized to interface between the exciter cards in the control rack and the EXAM card. In regulator applications, the same EXAM card may be used to interface to the field winding, but an exciter regulator option card (EROC) is used (as opposed to an EGDM card in the ground detector module) to perform most of the ground detector functionality. When a regulator is used, redundant ground detectors will generally not be used.

Other modifications to the embodiments described above can be made without departing from the spirit and scope of the invention, as is intended to be encompassed by the following claims and their legal equivalents.

This application is provided along with one (1) compact disc of a computer program listing that is provided as an Appendix, the contents of which are incorporated herein by reference in their entirety.

What is claimed is:

1. A system for detecting field ground, comprising:
   a sense resistor;
   an attenuator network;
   a reference signal source providing a reference signal to field leads of an electrical machine, the reference signal operatively coupled with the sense resistor and an attenuator network, wherein the attenuator network is coupled to the field leads resulting in a signal that biases the center of the field plus and minus the reference signal with respect to ground;
   a voltage controlled oscillator (VCO) adapted to measure differential voltage across the sense resistor; and
   control logic adapted to coordinate the collection of measurement data, and extract an estimate of ground fault resistance and location of a ground fault from the measured data.

2. The system of claim 1, wherein the control logic includes a first communication channel for forwarding measurement commands for commanding the system to make measurements, and a second communication channel for reading measurements made by the system.

3. The system of claim 1, wherein the control logic is configured to estimate the ground fault resistance by performing measurements on two consecutive half cycles of the reference signal.

4. The system of claim 1, wherein the control logic is configured to estimate the ground fault resistance (Rx) using the equation:

$$Rx = \{(2RRsRb^2 +$$
$$Rb^2)((Vfgn/Vfgp)Vs1 - Vs2) -$$
$$2RRsRb^2((Vfgn/Vfgp)*$$
$$Voscp - Voscn)\}/\{(2RbR^2 +$$
$$4RRbRs + 2RRb^2)(Vs2 -$$
$$(Vfgn/Vfgp)Vs1) + 4RRbRs$$
$$((Vfgn/Vfgp)*Voscp - Voscn)\},$$

where R represents an attenuator network coupled intermediate the reference signal and the field leads of the generator, Rb represents the resistance of bleed resistors, Vs1 and Vs2 represent, respectively, the voltage across the sense resistor Rs during the time the reference signal is on the positive and negative half cycles, Voscp and Voscn represent, respectively, the reference signal voltage on the positive and negative half cycles, and Vfgn and Vfgp represent, respectively, the field voltage during the time the reference signal is on the negative and positive half cycles.

5. The system of claim 1, wherein the control logic is configured to estimate the location of a ground fault using at least one of the equations:

$$x = (Vs1*(RRb^2 + 2R^2RbRx + 2$$
$$RRb^2Rx + 4RRbRsRx) -$$
$$(2RRb^2Rs + 4RRbRsRx)*Voscp$$
$$+ (RRsRb^2)*Vfgp)/(2$$
$$RRsRb^2*Vfgp);$$
$$x = (Vs2*(RRb^2 + 2R^2RbRx + 2RRb^2Rx + 4RRbRsRx) - (2RRb^2Rs + 4RRbRsRx)*Voscn + (RRsRb^2)*Vfgn)/(2RRsRb^2*Vfgn),$$

where R represents an attenuator network coupled intermediate the reference signal and the field leads of the generator, Rb represents the resistance of bleed resistors, Vs1 and Vs2 represent, respectively, the voltage across the sense resistor Rs during the time the reference signal is on the positive and negative half cycles, Voscp and Voscn represent, respectively, the reference signal voltage on the positive and negative half cycles, and Vfgn and Vfgp represent, respectively, the field voltage during the time the reference signal is on the negative and positive half cycles.

6. The system of claim 1, wherein the control logic is configured to detect an AC ground fault by measuring fundamental frequency voltages in the sense resistor.

7. The system of claim 6, wherein the control logic is configured to identify the fault as being an AC fault if the ground fault resistance is approximately 1500 ohms or less.

8. The system of claim 6, wherein the control logic is configured to make a measurement a prescribed interval of time after a command to transition to a next oscillator level is made.

9. The system of claim 1, wherein the system includes at least one of a redundant low frequency oscillator and voltage controlled oscillator.

10. The system of claim 1, wherein the control logic further includes diagnostic logic for automatically measuring differential voltage across the sense resistor with the oscillator set at a frequency which is higher than the normal operational frequency.

11. The system of claim 1, wherein the reference signal generator is a low frequency oscillator and the reference signal is a square wave.

12. The system of claim 1, wherein the electrical machine is a generator.

13. The system of claim 1, wherein the generator includes at least one of an excitation system and a regulator.

14. The system of claim 1, wherein the control logic is adapted to differentiate between AC and DC field ground faults.

15. In a control system for operating an electrical machine, a method for detecting and measuring a field ground fault, the method comprising:
   sensing the resistance of a sense resistor;
   applying a reference signal to field leads of the generator through the sense resistor and attenuator network, wherein the attenuator network is coupled to both field leads resulting in a signal that biases the center of the field within a range of plus and minus the reference signal with respect to ground;
   measuring the differential voltage across the sense resistor;
   analyzing the collected measurement data; and
   detecting a ground fault and estimating ground fault resistance and location of a ground fault from the measured data.

16. The method of claim 15 comprising the further step of generating and forwarding measurement commands for commanding the system to make and read measurements for ground fault detection.

17. The method of claim 15 further comprising the step of performing measurements on two consecutive half cycles of the reference signal and estimating the ground fault resistance from such half cycle measurements.

18. The method of claim 15 comprising the further step of estimating the ground fault resistance (Rx) using the equation:

$$x=(Vs1*(RRb\hat{\,}2+2R\hat{\,}2RbRx+2RRb\hat{\,}2Rx+4RRbRsRx)-(2RRb\hat{\,}2Rs+4RRbRsRx)*Voscp+(RRsRb\hat{\,}2)*Vfgp)/(2RRsRb\hat{\,}2*Vfgp),$$

$$x=(Vs2*(RRb\hat{\,}2+2R\hat{\,}2RbRx+2RRb\hat{\,}2Rx+4RRbRsRx)-(2RRb\hat{\,}2Rs+4RRbRsRx)*Voscn+(RRsRb\hat{\,}2)*Vfgn)/(2RRsRb\hat{\,}2*Vfgn),$$

where R represents an attenuator network coupled intermediate the reference signal and the field leads of the generator, Rb represents the resistance of bleed resistors, Vs1 and Vs2 represent, respectively, the voltage across the sense resistor Rs during the time the reference signal is on the positive and negative half cycles, Voscp and Voscn represent, respectively, the reference signal voltage on the positive and negative half cycles, and Vfgn and Vfgp represent, respectively, the field voltage during the time the reference signal is on the negative and positive half cycles.

19. The method of claim 15, wherein the step of estimating the location of a ground fault involves using at least one of the equations:

$$x=Vs1*(R\hat{\,}2Rb\hat{\,}2+2R\hat{\,}2RbRx+2RRb\hat{\,}2Rx+2RRB\hat{\,}2Rs+4RRbRsRx)-(2RRb\hat{\,}2Rs+4RRbRsRx)*Voscp+(RRsRb\hat{\,}2)*Vfgp/(2RRsRb\hat{\,}2*Vfgp);$$

$$x=Vs2*(R\hat{\,}2Rb\hat{\,}2+2R\hat{\,}2RbRx+2RRb\hat{\,}2Rx+2RRB\hat{\,}2Rs+4RRbRsRx)-(2RRb\hat{\,}2Rs+4RRbRsRx)*Voscn+(RRsRb\hat{\,}2)*Vfgn/(2RRsRb\hat{\,}2*Vfgn),$$

where R represents an attenuator network coupled intermediate the reference signal and the field leads of the generator, Rb represents the resistance of bleed resistors, Vs1 and Vs2 represent, respectively, the voltage across the sense resistor Rs during the time the reference signal is on the positive and negative half cycles, Voscp and Voscn represent, respectively, the reference signal voltage on the positive and negative half cycles, and Vfgn and Vfgp represent, respectively, the field voltage during the time the reference signal is on the negative and positive half cycles.

20. The method of claim 15 further comprising the step of detecting an AC ground fault by measuring fundamental frequency voltages in the sense resistor.

21. The method of claim 20, wherein an AC fault is detected if the ground fault resistance is approximately 1500 ohms or less.

* * * * *

UNITED STATES PATENT AND TRADEMARK OFFICE
CERTIFICATE OF CORRECTION

PATENT NO.         : 6,794,879 B2                                   Page 1 of 1
APPLICATION NO. : 09/986467
DATED                : September 21, 2004
INVENTOR(S)       : Rodney Allen Lawson et al.

It is certified that error appears in the above-identified patent and that said Letters Patent is hereby corrected as shown below:

Col. 6. line 54: replace "Vosco" with --Voscp--;

Col. 14, line 61: replace "tow" with --two--;

Col. 18, line 63: replace "de" with --dc--;

Col. 19. line 12: replace "Warn" with --Warm--;

Claim 4, col. 25, line 39, insert --R^2-- immediately before "Rb^2."

Signed and Sealed this

Seventeenth Day of October, 2006

JON W. DUDAS
*Director of the United States Patent and Trademark Office*